US009524919B2

United States Patent
Inaba et al.

(10) Patent No.: US 9,524,919 B2
(45) Date of Patent: Dec. 20, 2016

(54) SEMICONDUCTOR MODULE AND SEMICONDUCTOR DEVICE

(71) Applicant: FUJI ELECTRIC CO., LTD., Kawasaki-shi (JP)

(72) Inventors: Tetsuya Inaba, Matsumoto (JP); Yoshinari Ikeda, Matsumoto (JP); Motohito Hori, Matsumoto (JP); Daisuke Kimijima, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/069,404

(22) Filed: Mar. 14, 2016

(65) Prior Publication Data

US 2016/0293517 A1   Oct. 6, 2016

(30) Foreign Application Priority Data

Apr. 1, 2015   (JP) ................. 2015-075251

(51) Int. Cl.
| | |
|---|---|
| H01L 29/78 | (2006.01) |
| H01L 23/473 | (2006.01) |
| H01L 25/07 | (2006.01) |
| H01L 23/00 | (2006.01) |

(52) U.S. Cl.
CPC ............ *H01L 23/473* (2013.01); *H01L 24/72* (2013.01); *H01L 25/074* (2013.01); *H01L 29/7813* (2013.01)

(58) Field of Classification Search
None
See application file for complete search history.

(56) References Cited

U.S. PATENT DOCUMENTS

| | | | | |
|---|---|---|---|---|
| 3,105,922 A | * | 10/1963 | Matsushima | ........... H01L 25/03 257/104 |
| 5,591,993 A | * | 1/1997 | Nomura | .................. H02M 1/00 257/181 |
| 5,671,134 A | | 9/1997 | Nomura et al. | |
| 2006/0054959 A1 | * | 3/2006 | Mauder | ............. H01L 29/66181 257/301 |

FOREIGN PATENT DOCUMENTS

| | | | |
|---|---|---|---|
| JP | H07-312410 A | 11/1995 | |
| JP | H08-084483 A | 3/1996 | |

\* cited by examiner

*Primary Examiner* — Thao P Le
(74) *Attorney, Agent, or Firm* — Manabu Kanesaka

(57) ABSTRACT

A semiconductor module includes a semiconductor element having a gate electrode and source electrode on the front surface, and a drain electrode on the rear surface, the drain electrode being electrically connected to the front surface of a drain plate; a laminated substrate having, on the front surface of an insulating plate, a first circuit plate to which the gate electrode is electrically connected, and a second circuit plate to which the source electrode is electrically connected, and which is disposed on the front surface of the drain plate; a gate terminal disposed on the first circuit plate; a source terminal disposed on the second circuit plate; and a cover disposed opposite to the front surface of the drain plate, and having an opening in which the gate terminal and the source terminal are positioned and a guide groove contacting the opening and extending to the outer peripheral portion.

14 Claims, 22 Drawing Sheets

FIG. 12A
FIG. 12B
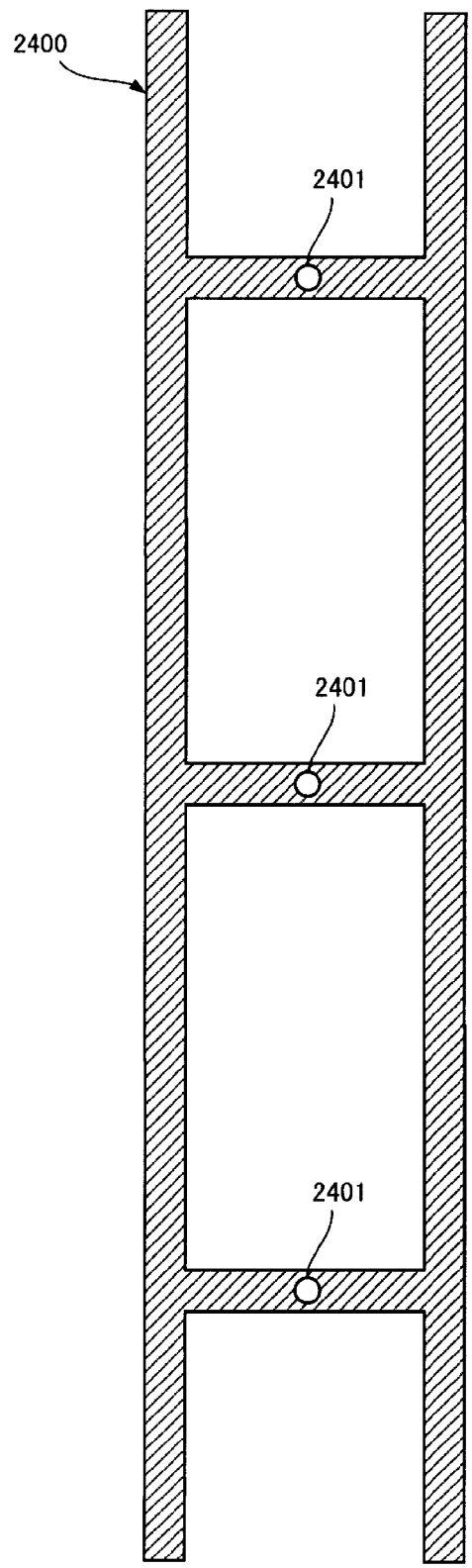
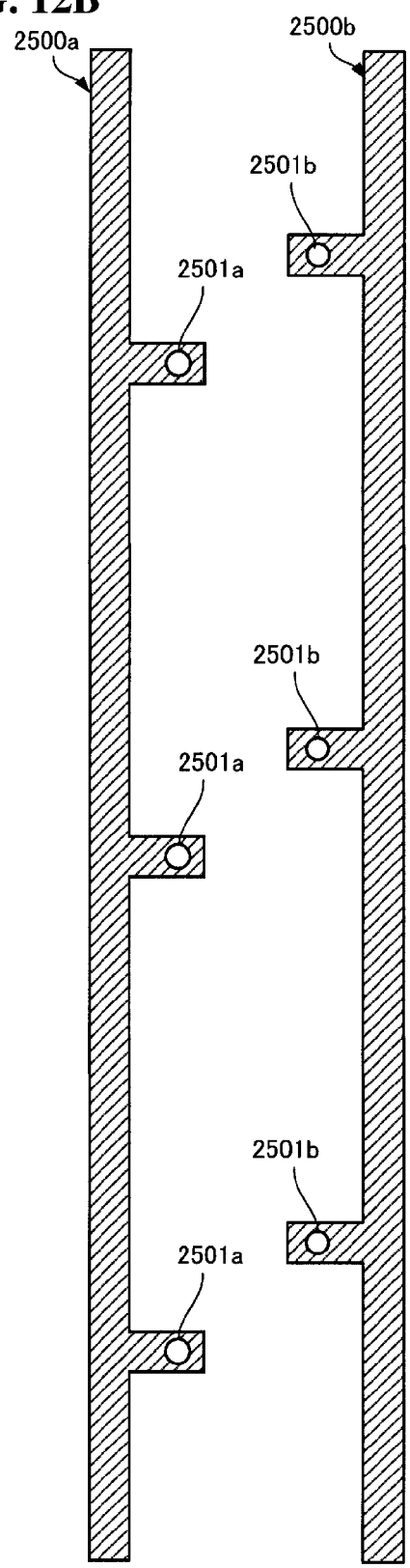

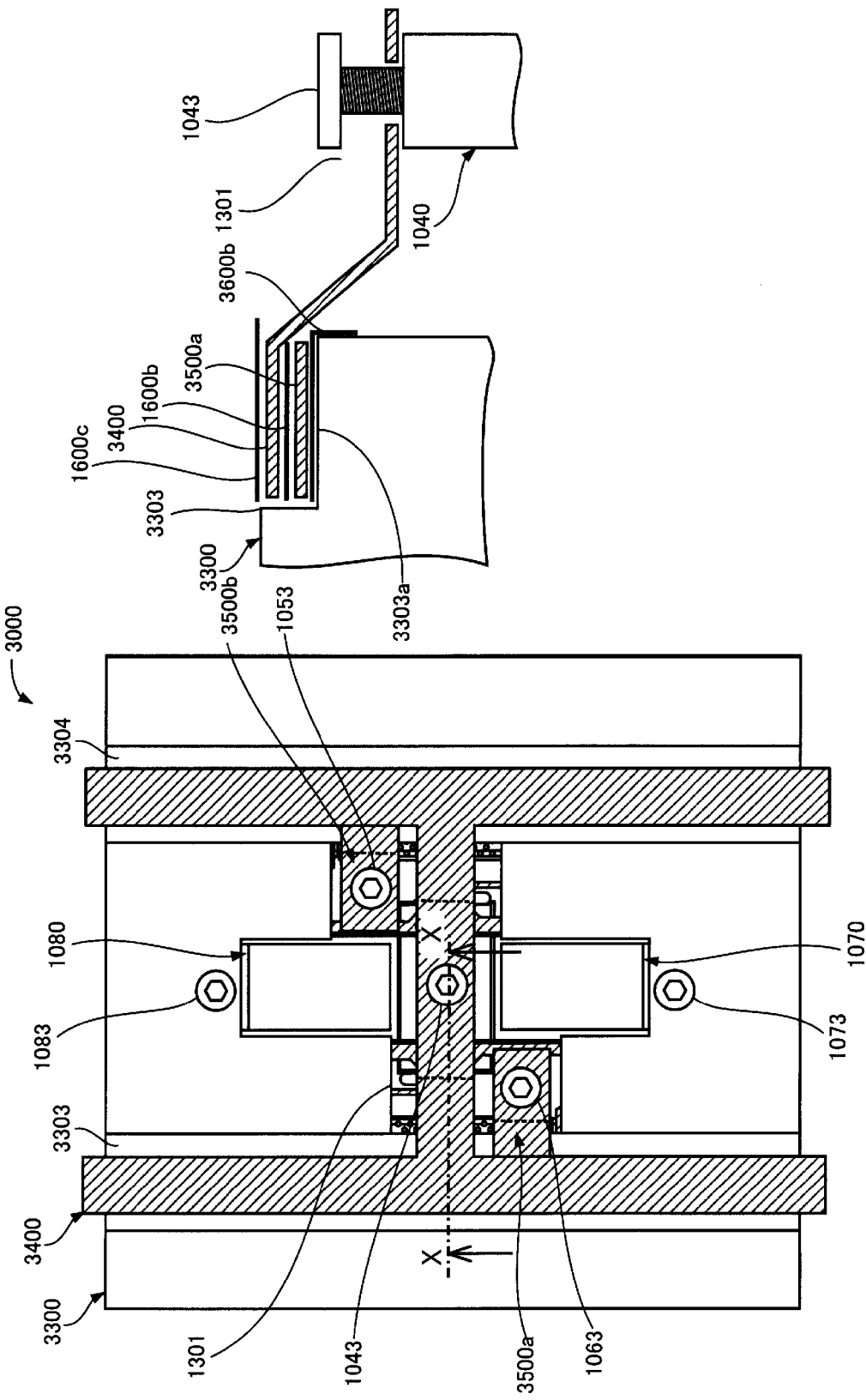

SEMICONDUCTOR MODULE AND SEMICONDUCTOR DEVICE

CROSS-REFERENCE TO RELATED APPLICATION

The application claims a priority of Japanese Patent Application No. 2015-075251 filed on Apr. 1, 2015, the disclosure of which is incorporated herein.

BACKGROUND OF THE INVENTION

1. Field of the Invention

The present invention relates to a semiconductor module and a semiconductor device including the same.

2. Description of the Background Art

As one of semiconductor devices, a semiconductor module including a plurality of semiconductor elements, such as IGBTs (Insulated Gate Bipolar Transistors) or FWDs (Free Wheeling Diodes), is widely used. For example, a function as a switching, a converter, or the like can be realized by connecting the semiconductor modules in parallel. A non-insulated semiconductor module, in these kinds of semiconductor modules, which has no insulating function inside can reduce the inductance of internal wiring compared with an insulated semiconductor module.

The non-insulated semiconductor module includes a gate terminal and source terminals on the upper surface and a drain terminal on the lower surface. Further, an integrated combination of a gate conductor and source conductor is disposed on the upper surface side, while a drain conductor is disposed on the lower surface side, and by bringing the conductors into pressure contact with the terminals from above and below, the terminals are electrically connected to the external (for example, refer to JP-A-7-312410).

However, in the semiconductor module of JP-A-312410, in the spring plate-like gate terminal brought into pressure contact by the gate conductor, the gate conductor slides while the semiconductor module is in operation, and the electrical resistance of a surface of the gate terminal in contact with the gate conductor increases. Therefore, there is the possibility that a malfunction occurs in the semiconductor module.

SUMMARY OF THE INVENTION

The invention, with this kind of point in mind, has for its object to provide a semiconductor, an occurrence of a malfunction of which is suppressed.

According to an aspect of the invention, there is provided a semiconductor module including a drain plate; a semiconductor element which has a gate electrode and source electrode on a front surface, and a drain electrode on a rear surface, and which is disposed on the front surface of the drain plate, the drain electrode being electrically connected to the drain plate; a laminated substrate which has an insulating plate, and a first circuit plate and a second circuit plate provided on the front surface of the insulating plate, and which is disposed on the front surface of the drain plate, the first circuit plate being electrically connected to the gate electrodes, and the second circuit plate being electrically connected to the source electrodes; a gate terminal disposed on the first circuit plate; a source terminal disposed on the second circuit plate; and a cover which has an opening and a guide groove and is disposed opposite to the front surface of the drain plate, and in the opening, the gate terminal and the source terminal being positioned, the guide groove contacting the opening and extending to the outer peripheral portion.

According to the disclosed technology, it is possible to prevent an occurrence of a malfunction of the semiconductor device and suppress deterioration in the characteristics of the semiconductor device.

BRIEF DESCRIPTION OF THE DRAWINGS

FIGS. 12A and 12B are diagrams showing wiring plates of the semiconductor device of the second embodiment.

FIGS. 14A and 14B are diagrams showing a semiconductor module of a fourth embodiment.

DETAILED DESCRIPTION OF THE INVENTION

Figure 1A:
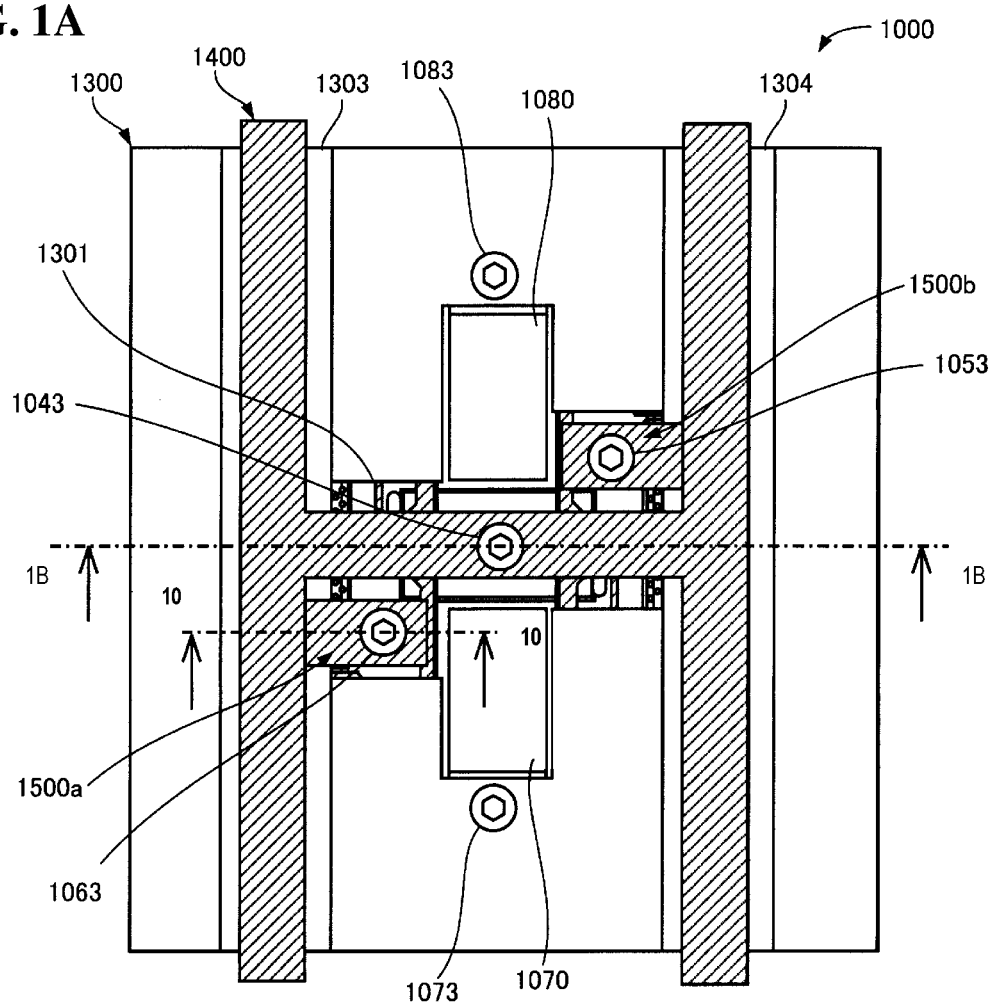
FIGS. 1A and 1B are diagrams showing a semiconductor module of a first embodiment.

Hereafter, a description will be given, referring to the drawings, of the embodiments.

First Embodiment

A description will be given, using FIGS. 1A to 10, of a semiconductor module of a first embodiment.

Figure 1B:
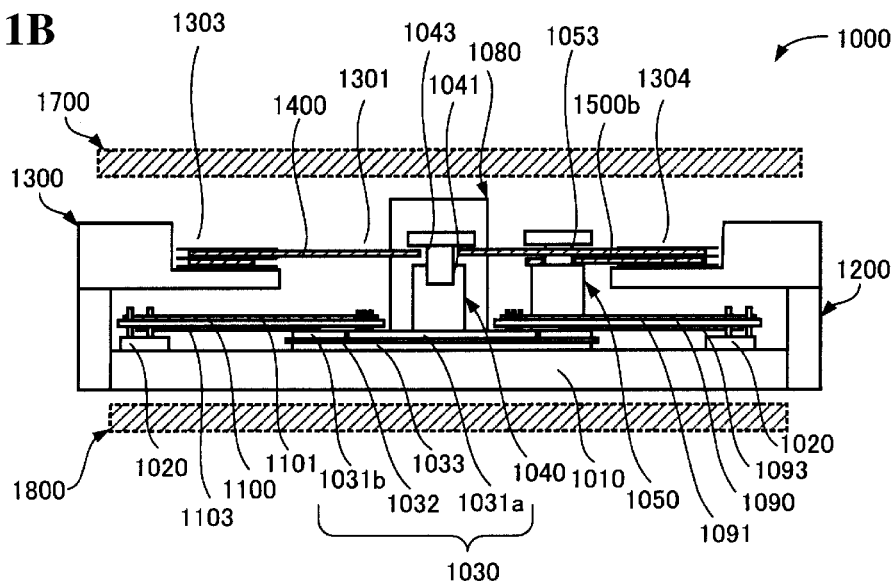

FIGS. 1A and 1B are diagrams showing the semiconductor module of the first embodiment.

FIG. 1A shows a plan view of the semiconductor module, and FIG. 1B shows a sectional view on the dashed dotted line X1-X1 of FIG. 1A.

Also, FIGS. 2A to 10 are diagrams showing configurations of the semiconductor module of the first embodiment.

Figure 2A:
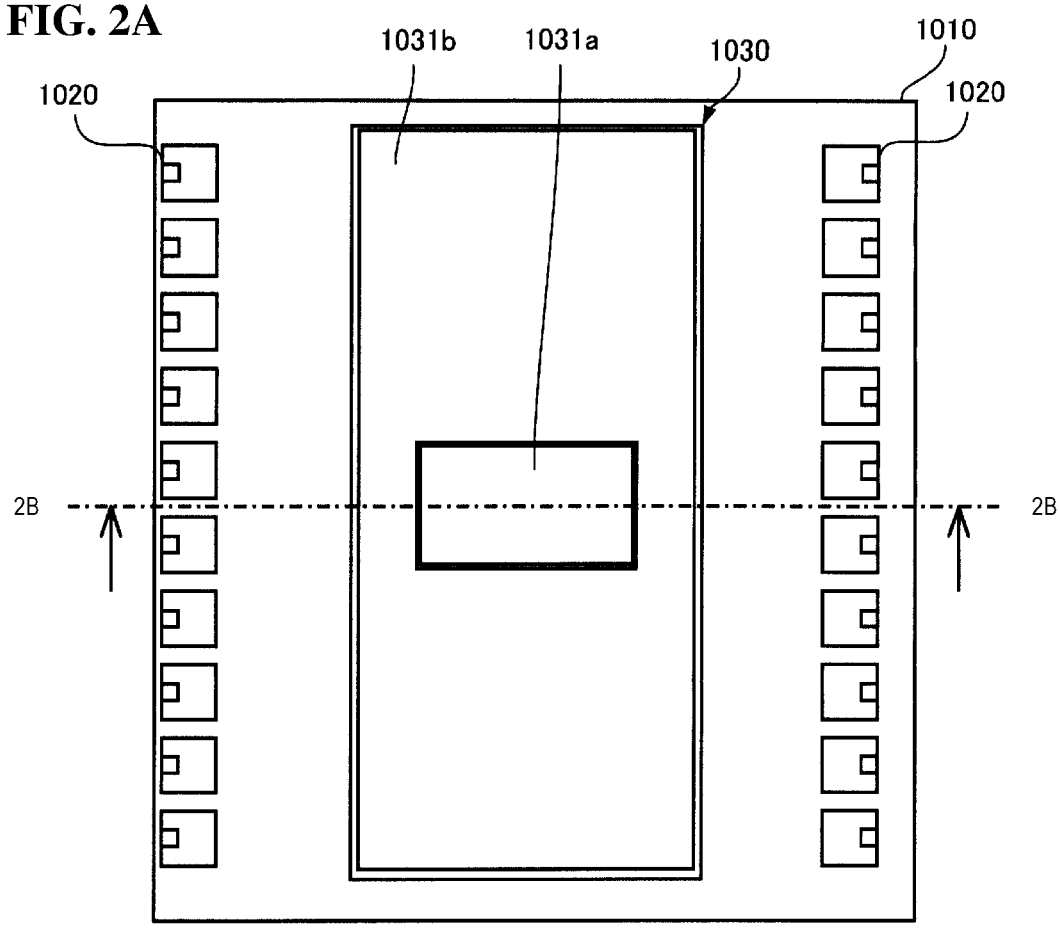
FIGS. 2A and 2B are diagrams showing a configuration of the semiconductor module of the first embodiment.
Figure 2B:
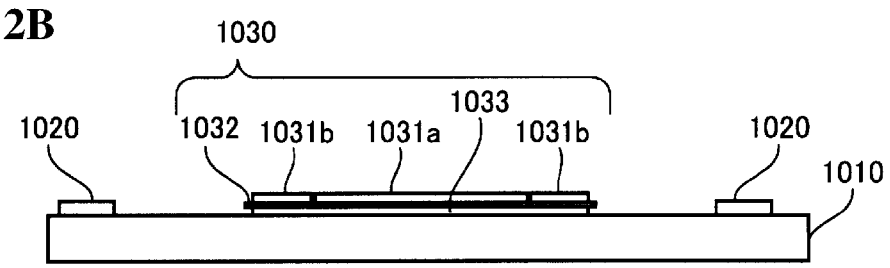

FIG. 2A shows a plan view of a drain plate 1010, and FIG. 2B shows a sectional view on the dashed dotted line X-X of FIG. 2A.

Figure 3A:
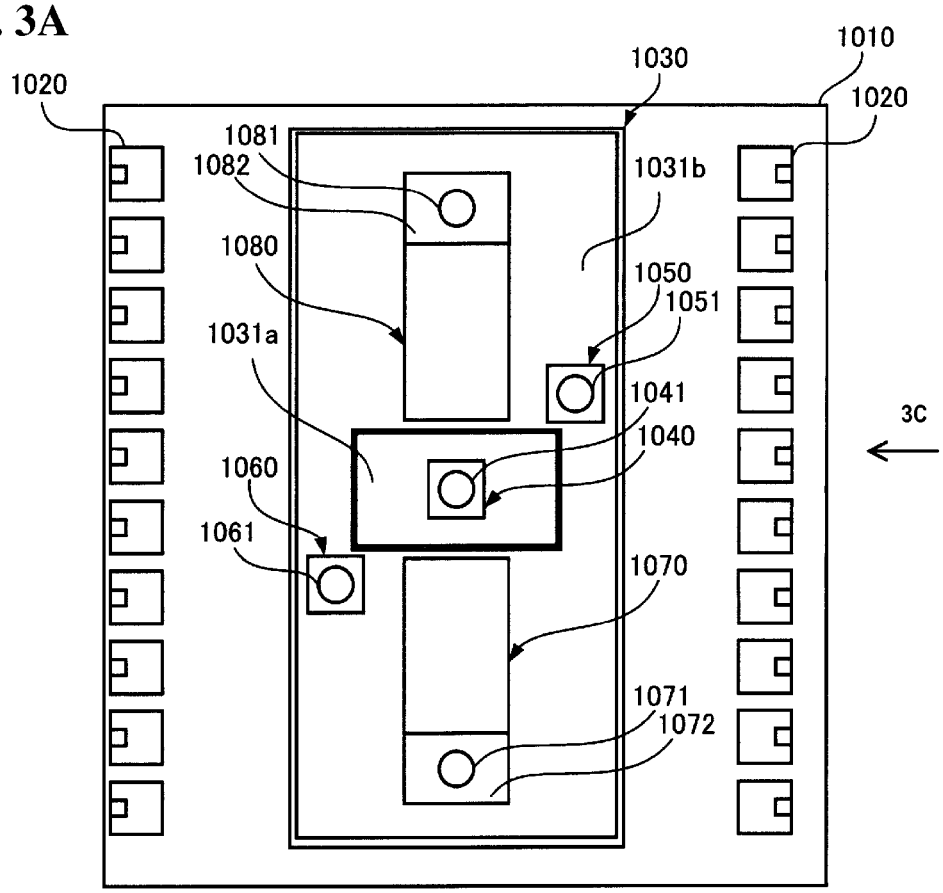
FIGS. 3A to 3C are diagrams showing a configuration of the semiconductor module of the first embodiment.
Figure 3B:
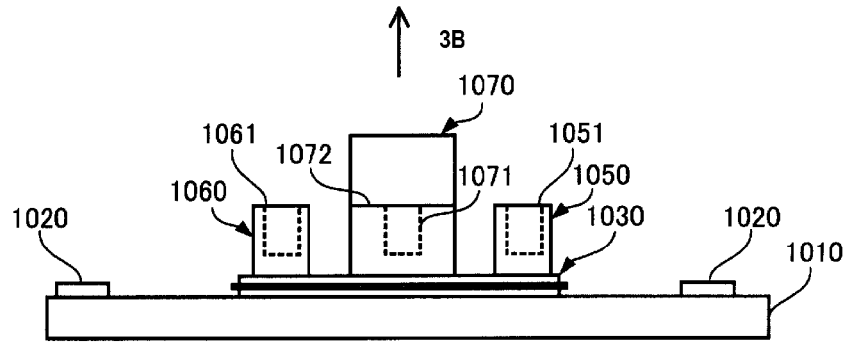
Figure 3C:
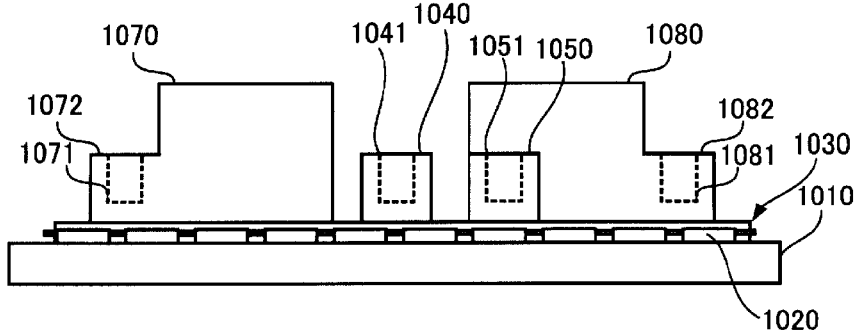

FIG. 3A shows a plan view of the drain plate 1010, FIG. 3B shows a side view in the direction of the arrow 3B of FIG. 3A, and FIG. 3C shows a side view in the direction of the arrow 3C of FIG. 3A.

Figure 8A:
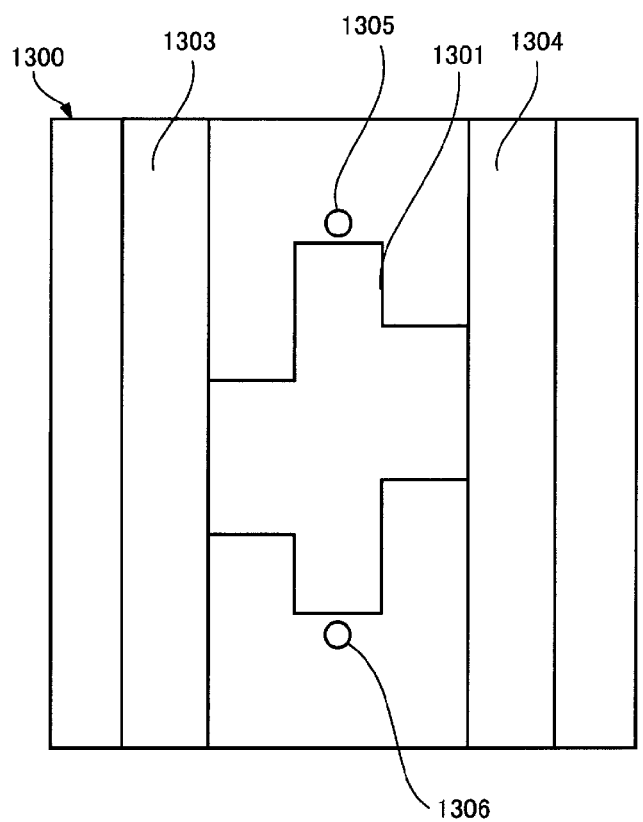
FIGS. 8A and 8B are diagrams showing a configuration of the semiconductor module of the first embodiment.
Figure 8B:
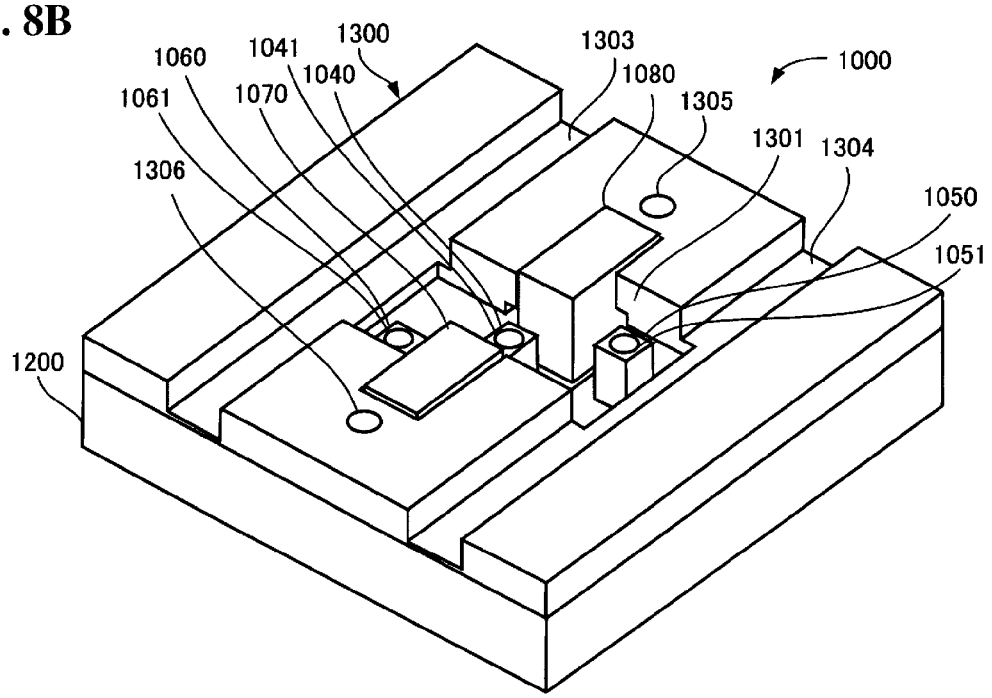

FIG. 8A shows a plan view of a cover 1300, and FIG. 8B shows a perspective view of the semiconductor module (in which no gate plate 1400 or auxiliary source plates 1500a and 1500b are disposed).

Figure 9A:
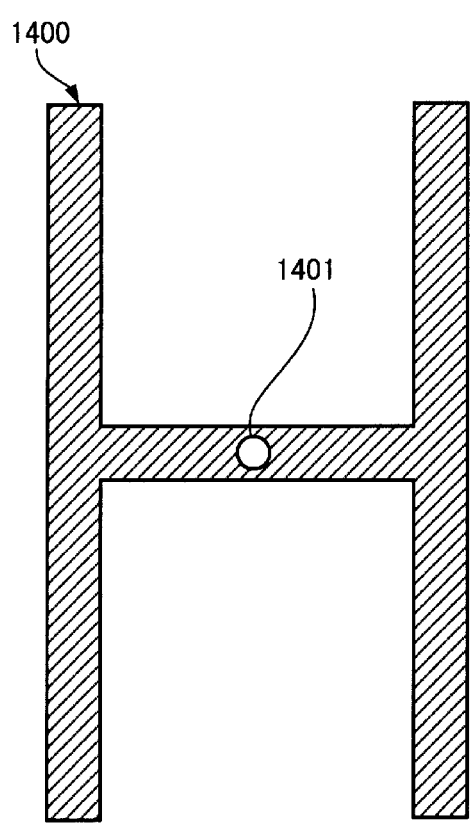
FIGS. 9A and 9B are a diagram showing a configuration of the semiconductor module of the first embodiment.
Figure 9B:
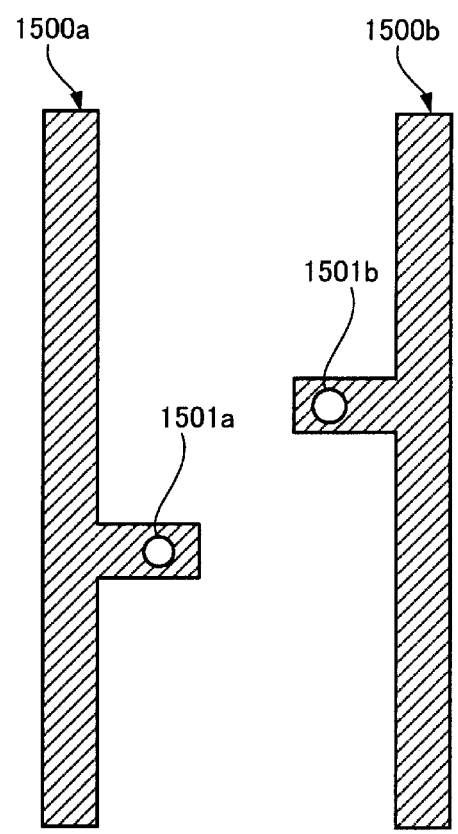
Figure 10:
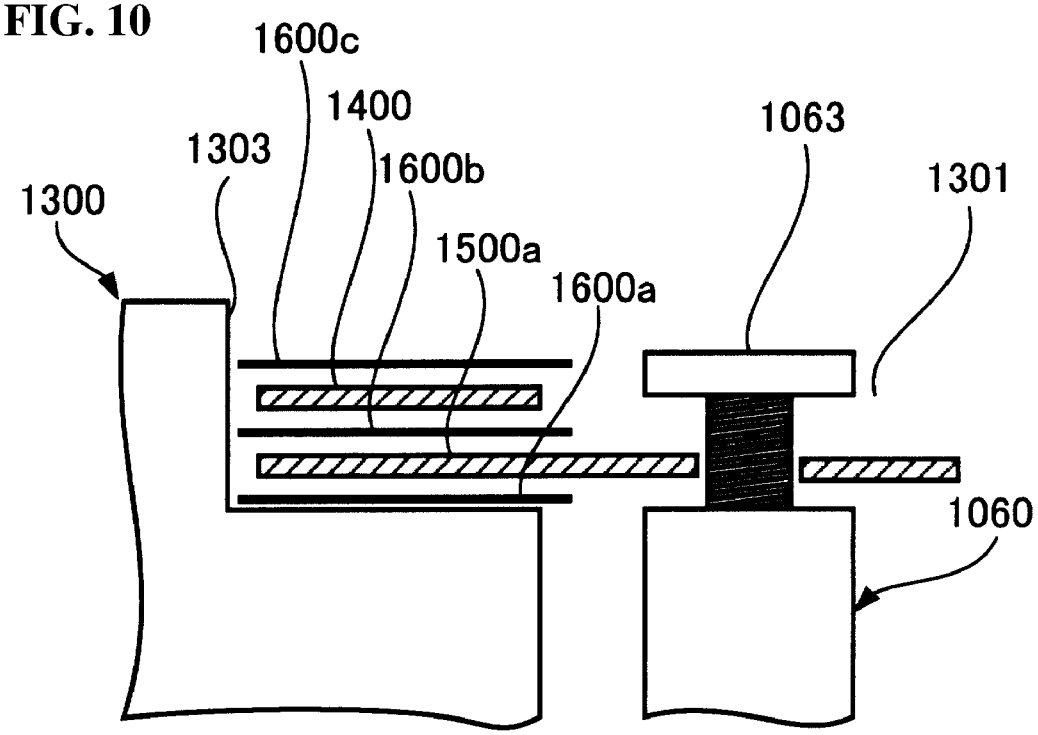
FIG. 10 is a diagram showing a configuration of the semiconductor module of the first embodiment.

FIG. 9A shows a plan view of the gate plate 1400, and FIG. 9B shows a plan view of the auxiliary source plates 1500a and 1500b. FIG. 10 shows an enlarged sectional view on the dashed dotted line 10-10 of FIG. 1A.

A non-insulated semiconductor module 1000 includes the drain plate 1010, semiconductor elements 1020, a laminated substrate 1030, a gate terminal 1040, an auxiliary source terminal 1050, and the cover 1300, as shown in FIGS. 1A and 1B. Also, the semiconductor module 1000 further includes the gate plate 1400, an auxiliary source terminal 1060, the auxiliary source plates 1500a and 1500b, and an insulating frame 1200.

The drain plate 1010 is formed of a conductive material such as copper or aluminum. The component members of the semiconductor module 1000 are mounted on the front surface of the drain plate 1010, and power from an external power supply is input into the rear surface. That is, the drain plate 1010 functions as the drain terminal of the non-insulated semiconductor module 1000.

The semiconductor elements 1020 are each a vertical power semiconductor element, such as a power MOSFET (Metal Oxide Semiconductor Field Effect Transistor) or an IGBT. In the first embodiment, a description will be given of a case in which the semiconductor elements 1020 are power MOSFETs. The semiconductor elements 1020 each include a gate electrode and source electrode on the front surface and a drain electrode on the rear surface. The semiconductor elements 1020 are disposed on the front surface of the drain plate 1010. Further, the drain electrodes on the rear surfaces of the semiconductor elements 1020 and the drain plate 1010 are electrically connected by being joined with a conductive joining material such as a solder.

The laminated substrate 1030 includes an insulating plate 1032, a first circuit plate 1031a, and a second circuit plate 1031b, as shown in FIGS. 2A and 2B. The laminated substrate 1030 is disposed in a position, on the front surface of the drain plate 1010, which is different from the positions on which the semiconductor elements 1020 are disposed. Also, the first circuit plate 1031a and the gate electrodes of the semiconductor elements 1020 are electrically connected, and the second circuit plate 1031b and the source electrodes of the semiconductor elements 1020 are electrically connected. The details of these connections will be described hereafter.

The gate terminal 1040 is disposed on the first circuit plate 1031a. A pair of source terminals 1070 and 1080 is disposed on the second circuit plate 1031b. A pair of the auxiliary source terminals 1050 and 1060 is disposed on the second circuit plate 1031b. Each of the terminals is formed of a conductive material such as copper or aluminum. Also, each of the terminals and the first circuit plate 1031a or second circuit plate 1031b is electrically connected by being joined with a conductive material such as a solder.

As shown in FIGS. 8A and 8B, the cover 1300, being rectangular, includes guide grooves 1303 and 1304. The cover 1300 is disposed opposite to the front surface of the drain plate 1010. Further, the gate terminal 1040, the source terminals 1070 and 1080, and the auxiliary source terminals 1050 and 1060 are positioned in an opening 1301. The guide grooves 1303 and 1304 contact the opening 1301 and extend to the outer peripheral portion from the positions in which the guide grooves 1303 and 1304 contact the opening 1301. It is preferable that the cover 1300 is formed of a conductive material such as copper or aluminum.

The cover 1300 is fixed to the source terminals 1070 and 1080 by bolts 1073 and 1083 being screwed in bolt holes 1305 and 1306.

The gate plate 1400, being disposed in the guide grooves 1303 and 1304, is electrically connected to the gate terminal 1040 and extended along the guide grooves 1303 and 1304 to the outer peripheral portion. The gate terminal 1040 is positioned on a line crossing the respective midpoints of the guide grooves 1303 and 1304.

The auxiliary source plates 1500a and 1500b, being disposed in the guide grooves 1303 and 1304, are electrically connected to the auxiliary source terminals 1050 and 1060 respectively. Also, the auxiliary source plates 1500a and 1500b are extended along the guide grooves 1303 and 1304 to the outer peripheral portion while being insulated from the gate plate 1400 by an insulating layer 1600b.

The gate plate 1400, being H-shaped in the first embodiment, is fixed at its central portion with a bolt 1043 in a bolt hole 1041 of the gate terminal 1040. The auxiliary source plates 1500a and 1500b are also fixed with bolts 1053 and 1063 in bolt holes 1051 and 1061 of the auxiliary source terminals 1050 and 1060.

In this kind of semiconductor module 1000, a drain conductor 1800 is pressed against the drain plate 1010, and a source conductor 1700 is pressed against the source terminals 1070 and 1080, thus performing pressure contact from above and below. By so doing, the external power supply and the semiconductor module 1000 can be electrically connected. Also, a gate driver unit (not shown) applies a gate voltage to the gate plate 1400 which is extended to the outer peripheral portion and taken out to the side portion of the semiconductor module 1000. By so doing, it is possible to control the switching operation of the semiconductor elements 1020.

Hereafter, a description will be given of a configuration and assembly of the semiconductor module having this kind of configuration.

Firstly, as shown in FIGS. 2A and 2B, the laminated substrate 1030 is disposed in the central portion of the drain plate 1010, and a plurality of semiconductor elements 1020 is disposed on either side of the laminated substrate 1030.

The first circuit plate 1031a and the second circuit plate 1031b are disposed on the front surface of the insulating plate 1032. The first circuit plate 1031a and the second circuit plate 1031b are formed of a conductive material such as copper or aluminum. The first circuit plate 1031a and the second circuit plate 1031b are electrically insulated from each other, and the second circuit plate 1031b is disposed to enclose the first circuit plate 1031a. Also, a metal plate 1033 formed of, for example, copper is provided on the rear surface of the insulating plate 1032. By disposing the metal plate 1033, it is possible to join the drain plate 1010 and laminated substrate 1030 by soldering. In the case of joining the drain plate 1010 and laminated substrate 1030 with an adhesive, the metal plate 1033 does not have to exist.

Next, as shown in FIGS. 3A to 3C, the gate terminal 1040, which is columnar and in the upper surface of which the bolt hole 1041 is provided, is installed in the central portion of the first circuit plate 1031a of the laminated substrate 1030.

Also, the pair of source terminals 1070 and 1080 is installed on the second circuit plate 1031b so as to sandwich the first circuit plate 1031a. Stepped down surfaces 1072 and 1082 are formed in the source terminals 1070 and 1080 respectively, and bolt holes 1071 and 1081 are formed in the stepped down surfaces 1072 and 1082 respectively.

Furthermore, the auxiliary source terminals 1050 and 1060 are installed on the second circuit plate 1031b. The auxiliary source terminals 1050 and 1060 are installed, for example, to sandwich the first circuit plate 1031a and alongside of the source terminals 1070 and 1080. The bolt holes 1051 and 1061 are formed in the auxiliary source terminals 1050 and 1060 respectively. FIG. 3A shows one example of the positions for installing the auxiliary source terminals 1050 and 1060, and the auxiliary source terminals 1050 and 1060 may be installed in any respective positions on the second circuit plate 1031b.

Figure 4:
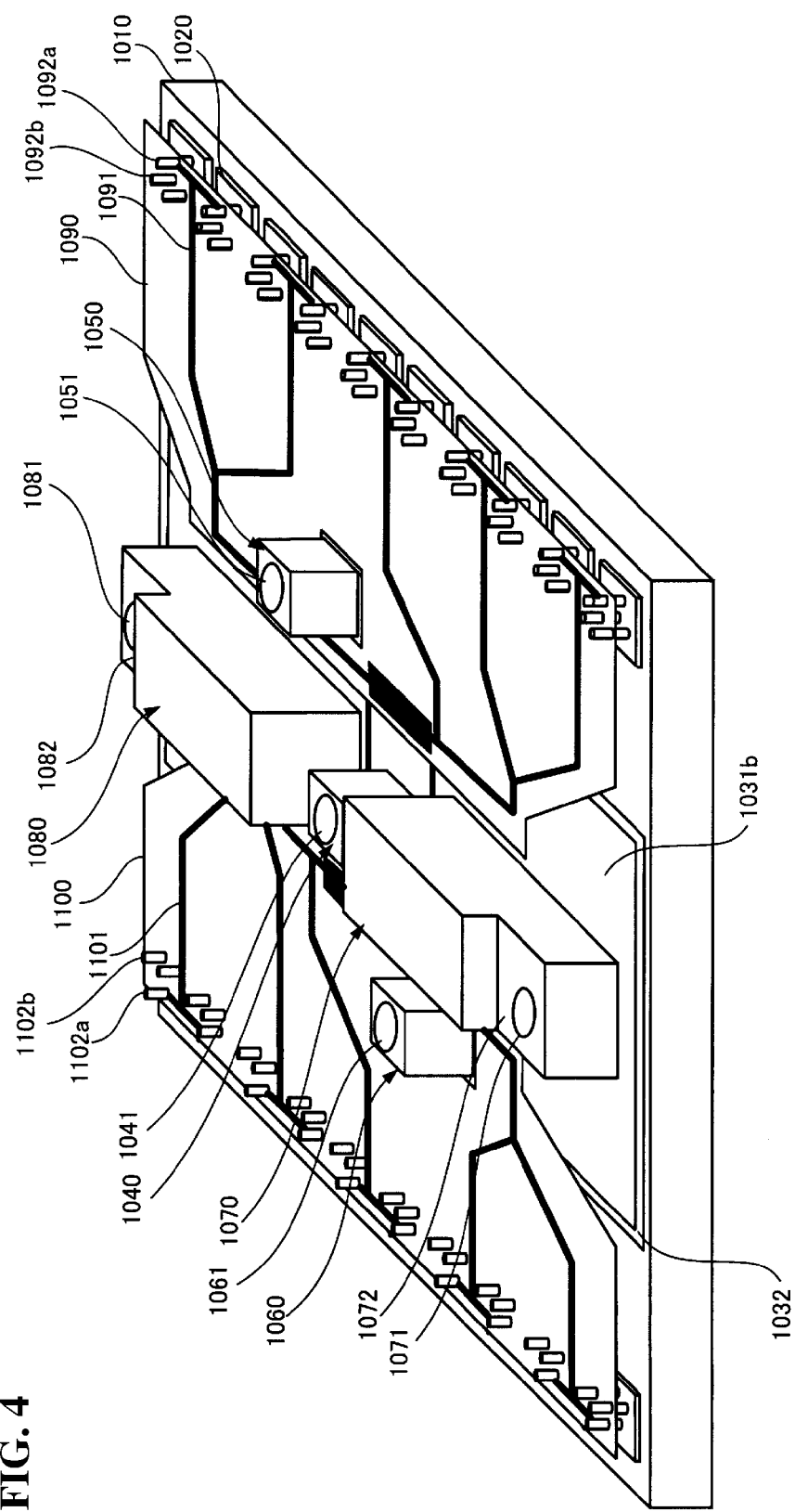
FIG. 4 is a diagram showing a configuration of the semiconductor module of the first embodiment.
Figure 5:
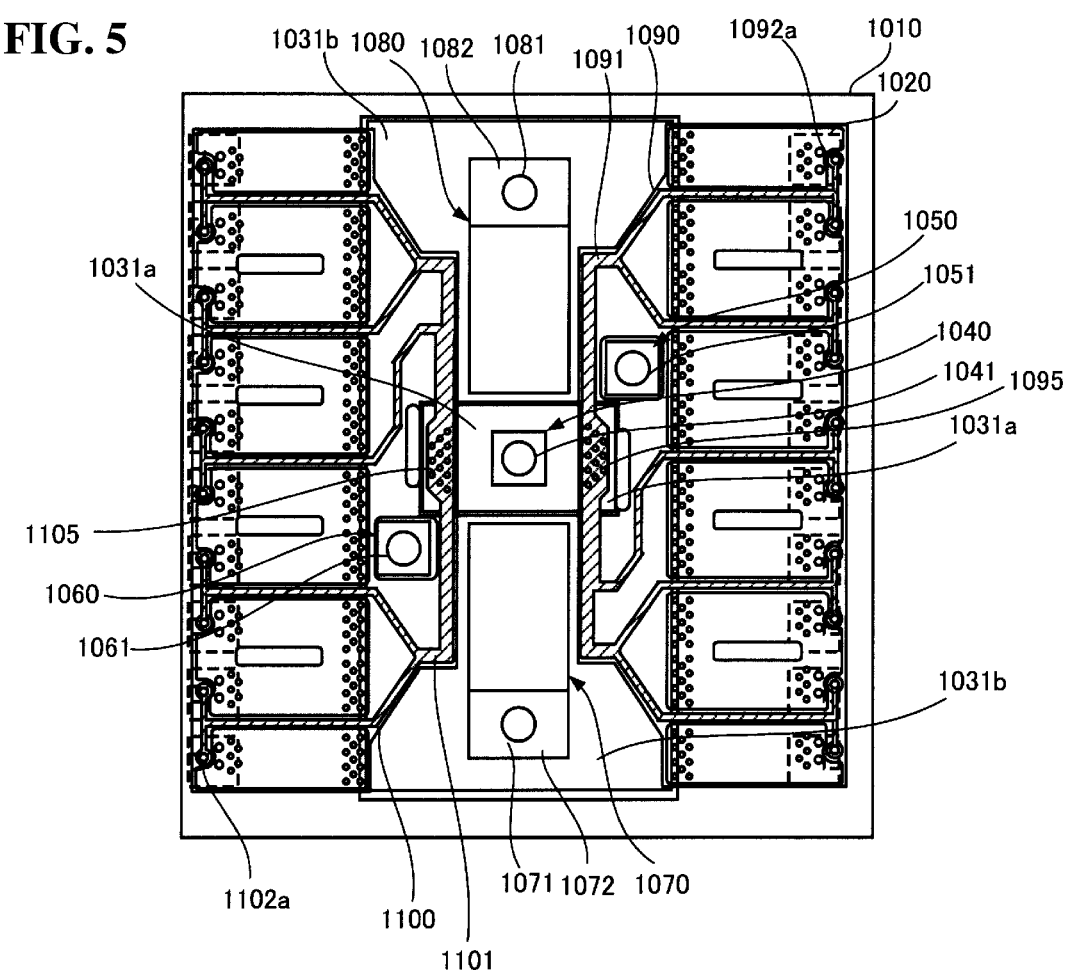
FIG. 5 is a diagram showing a configuration of the semiconductor module of the first embodiment.
Figure 6:
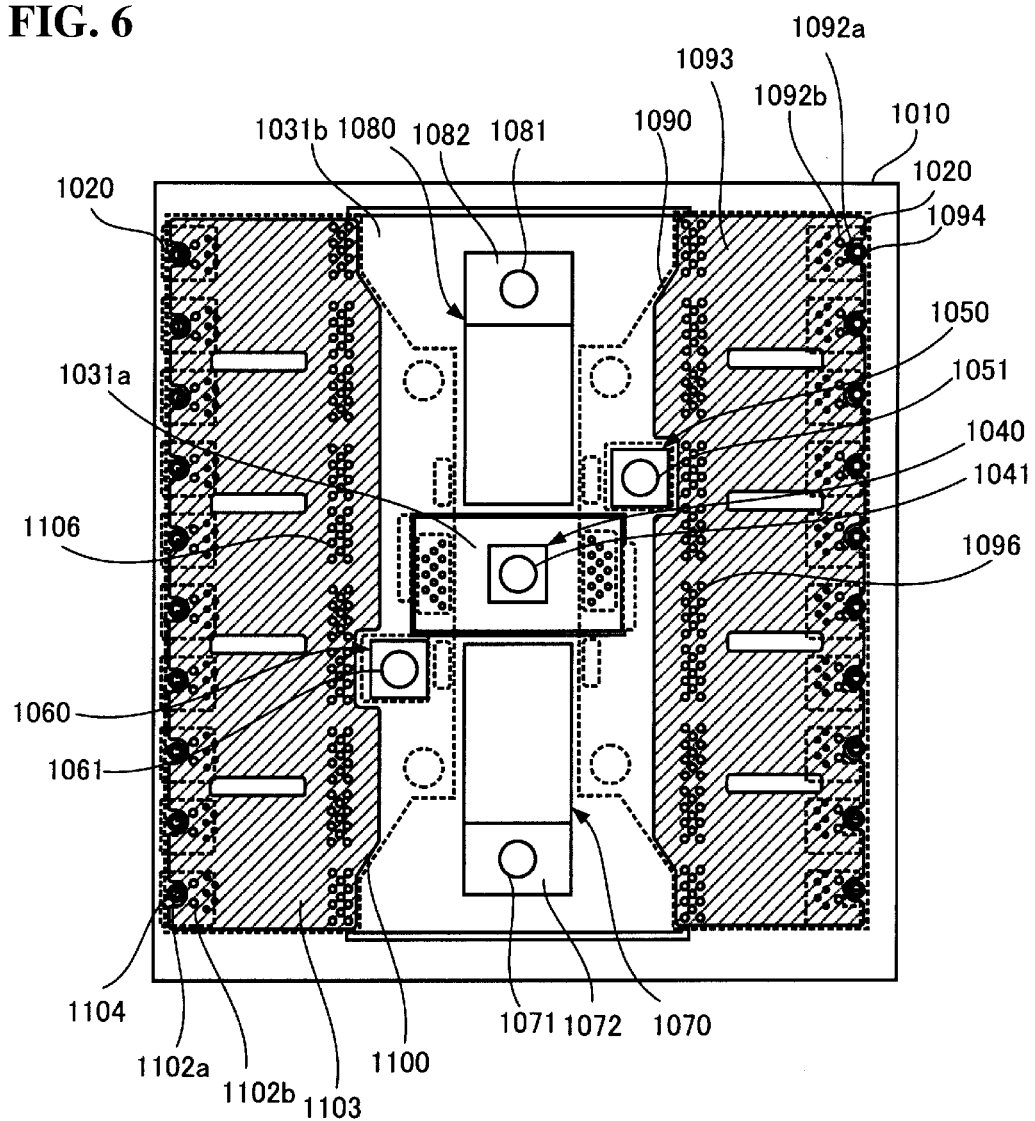
FIG. 6 is a diagram showing a configuration of the semiconductor module of the first embodiment.

Next, as shown in FIGS. 4 to 6, printed circuit boards 1090 and 1100 are installed between the plurality of semiconductor elements 1020 and the first circuit plate 1031a and second circuit plate 1031b. The printed circuit boards 1090 and 1100 are optimized in shape so as not to interfere with the auxiliary source terminals 1050 and 1060 when installing. Gate wiring layers 1091 and 1101, which are disposed one on the front surface of the respective printed circuit board 1090 and 1100, are electrically connected to the gate electrodes of the plurality of semiconductor elements 1020 by way of corresponding conductive posts 1092a and 1102a. Also, the gate wiring layers 1091 and 1101 are electrically connected to the first circuit plate 1031a of the laminated substrate 1030 by way of gate connection portions 1095 and 1105.

Also, source wiring layers 1093 and 1103, which are disposed on the rear surface of the respective printed circuit board 1090 and 1100, are electrically connected to the source electrodes of the plurality of semiconductor elements 1020 by way of corresponding conductive posts 1092b and 1102b. Also, the source wiring layers 1093 and 1103 are electrically connected to the second circuit plate 1031b of the laminated substrate 1030 by way of source connection portions 1096 and 1106.

In this way, the semiconductor elements 1020 and the laminated substrate 1030 are electrically connected using the printed circuit boards 1090 and 1100 and conductive posts 1092a, 1092b, 1102a, and 1102b.

Through holes 1094 and 1104 are formed in source wiring layer 1093 and 1103. The conductive posts 1092a and 1102a connected to the gate wiring layers 1091 and 1101 of the printed circuit boards 1090 and 1100 are inserted in the through holes 1094 and 1104. Therefore, the conductive posts 1092a and 1102a and the source wiring layers 1093 and 1103 are kept electrically insulated.

Figure 7:
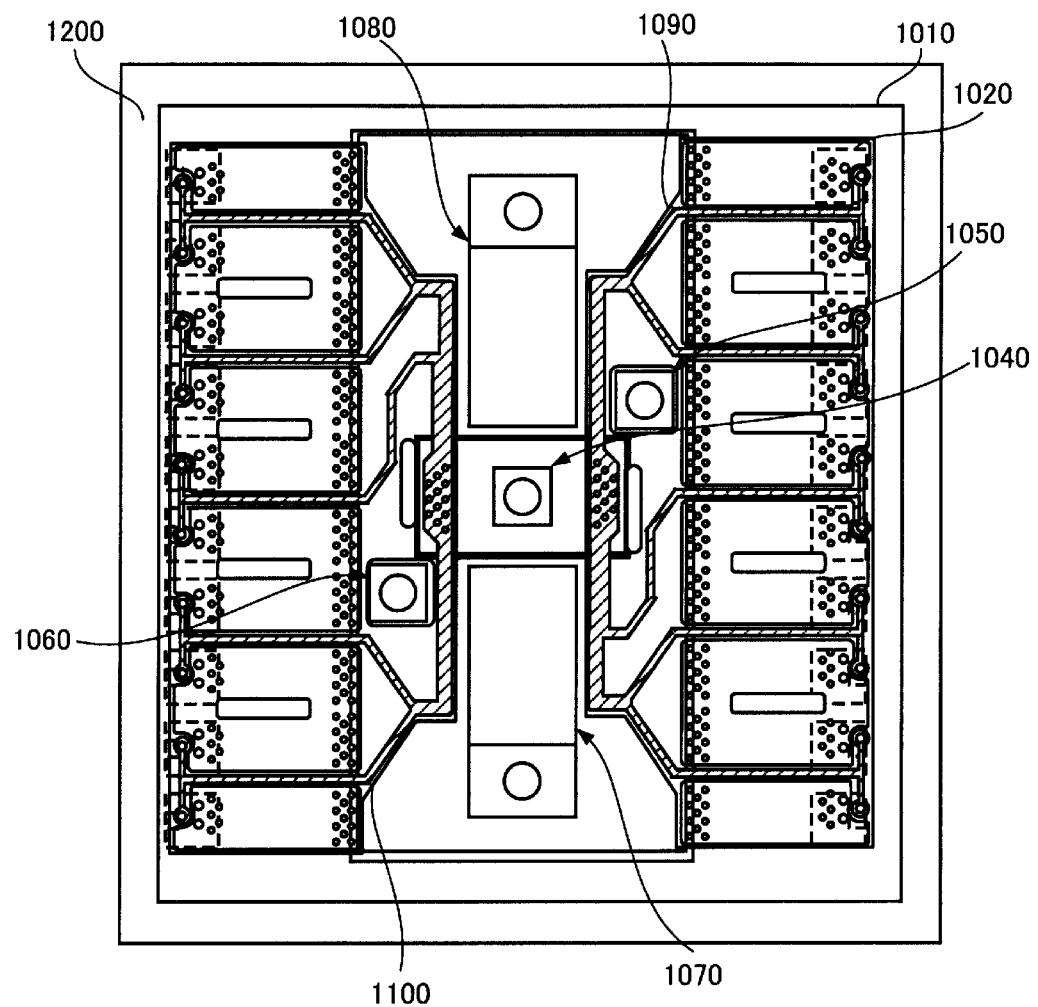
FIG. 7 is a diagram showing a configuration of the semiconductor module of the first embodiment.

The drain plate 1010 on which the individual components are installed in this way is provided in the frame 1200 covering the four sides, as shown in FIG. 7.

Next, the opening 1301 and the bolt holes 1305 and 1306 are formed in the cover 1300 covering the frame 1200, as shown in FIG. 8A. Furthermore, the guide grooves 1303 and 1304, which are linear in the up-down direction in FIG. 8A, are formed in the cover 1300 so as to contact the opening 1301 and extended to the outer peripheral portion.

When this kind of cover 1300 covers the frame 1200, the semiconductor module 1000 shown in FIG. 8B is provided. In the semiconductor module 1000, the gate terminal 1040, the source terminals 1070 and 1080, and the auxiliary source terminals 1050 and 1060 are positioned in the opening 1301 and disposed so that at least one portion of each terminal is exposed from the opening 1301. Also, the bolt holes 1305 and 1306 are aligned with the bolt holes 1071 and 1081 of the source terminals 1070 and 1080, and the cover 1300 is fixed with the bolts 1073 and 1083.

The depth of the guide grooves 1303 and 1304 formed in the cover 1300 matches with, for example, the height of the gate terminal 1040 and auxiliary source terminals 1050 and 1060.

Next, as shown in FIGS. 9A, 9B and 10, an insulating layer 1600a is disposed, and then, the auxiliary source plate 1500a is disposed, in the guide groove 1303 of the cover 1300. When disposing, a bolt hole 1501a of the auxiliary source plate 1500a is aligned with the bolt hole 1061 of the auxiliary source terminal 1060, and the auxiliary source plate 1500a is fixed with the bolt 1063. The auxiliary source plate 1500b is also disposed in the guide groove 1304, via the insulating layer 1600a, in the same way. At this time, a bolt hole 1501b of the auxiliary source plate 1500b is aligned with the bolt hole 1051 of the auxiliary source terminal 1050, and the auxiliary source plate 1500b is fixed with the bolt 1053.

Also, the insulating layer 1600b is disposed on the auxiliary source plates 1500a and 1500b disposed in the guide grooves 1303 and 1304, and the gate plate 1400 shown in FIG. 9A is disposed on the insulating layer 1600b. When disposing, a bolt hole 1401 of the gate plate 1400 is aligned with the bolt hole 1041 of the gate terminal 1040, and the gate plate 1400 is fixed with the bolt 1043. An insulating layer 1600c is further disposed on the gate plate 1400.

That is, in the guide groove 1303, the insulating layer 1600a, the auxiliary source plate 1500a, the insulating layer 1600b, the gate plate 1400, and the insulating layer 1600c are stacked in the order named, as shown in FIG. 10. Also, in the guide groove 1304, the insulating layer 1600a, the auxiliary source plate 1500b, the insulating layer 1600b, the gate plate 1400, and the insulating layer 1600c are stacked in the order named.

When the gate driver unit is connected to the auxiliary source plate 1500a and 1500b installed in this way, the gate driver unit can measure a source current responding to a gate voltage.

In the semiconductor module 1000 of the first embodiment, by the guide grooves 1303 and 1304 being provided in the cover 1300, it is possible to dispose the gate plate 1400 in a position lower than the upper surfaces of the source terminals 1070 and 1080. By so doing, it is possible to secure a space necessary to dispose the bolt 1043 to join the gate plate 1400 and gate terminal 1040. Further, by firmly joining the gate plate 1400 and gate terminal 1040 with the bolt 1043, an occurrence of friction of the gate terminal 1040 when in operation is suppressed. Therefore, an increase in the electrical resistance of and heat generation in the gate terminal 1040 are suppressed, thus preventing an occurrence of a malfunction of the semiconductor module 1000.

Also, in the semiconductor module 1000, the auxiliary source terminals 1050 and 1060 are installed, and the auxiliary source plates 1500a and 1500b joined to the auxiliary source terminals 1050 and 1060 are extended from the guide grooves 1303 and 1304. Therefore, it is possible to measure a source current relative to a gate voltage, and it is possible to accurately control a gate voltage applied so that a desired source current is output.

Also, the gate plate 1400 and the auxiliary source plates 1500a and 1500b are disposed to be stacked in the guide grooves 1303 and 1304. Therefore, it is possible to reduce gate wiring inductance, thus enabling a high speed operation of the semiconductor module.

Also, in the semiconductor module 1000, as the semiconductor elements 1020, the laminated substrate 1030 and the like, is covered with the conductive cover 1300, it is possible to block out noise occurring inside the semiconductor module.

Also, as the gate plate 1400 and the auxiliary source plates 1500a and 1500b are housed in the guide grooves 1303 and 1304, the semiconductor module 1000 is reduced in size.

In the first embodiment, a description is given, as an example, of a case in which the auxiliary source plates 1500a and 1500b are disposed first, and then, the gate plate 1400 is disposed, in the guide grooves 1303 and 1304. Apart from this case, it is also possible to dispose the gate plate 1400 first and then dispose the auxiliary source plates 1500a and 1500b.

Also, in the first embodiment, a description is given of a case in which power MOSFETs are used as the semiconductor elements 1020, but the invention is not limited to this, and IGBTs may be used as the semiconductor elements 1020. In this case, the drain electrodes in the first embodiment may be replaced with collector electrodes, and the source electrodes in the first embodiment may be replaced with emitter electrodes. Also, other switching elements may be used.

That is, in the specification and claims of the first application, the "drain electrodes" collectively mean the anode side electrodes of the semiconductor elements 1020, and the "source electrodes" collectively mean the cathode side electrodes of the semiconductor elements 1020.

Second Embodiment

In a second embodiment, a description will be given, using FIGS. 11, 12A, and 12B, of a semiconductor device into which a plurality of the semiconductor modules shown in the first embodiment is combined.

Figure 11:
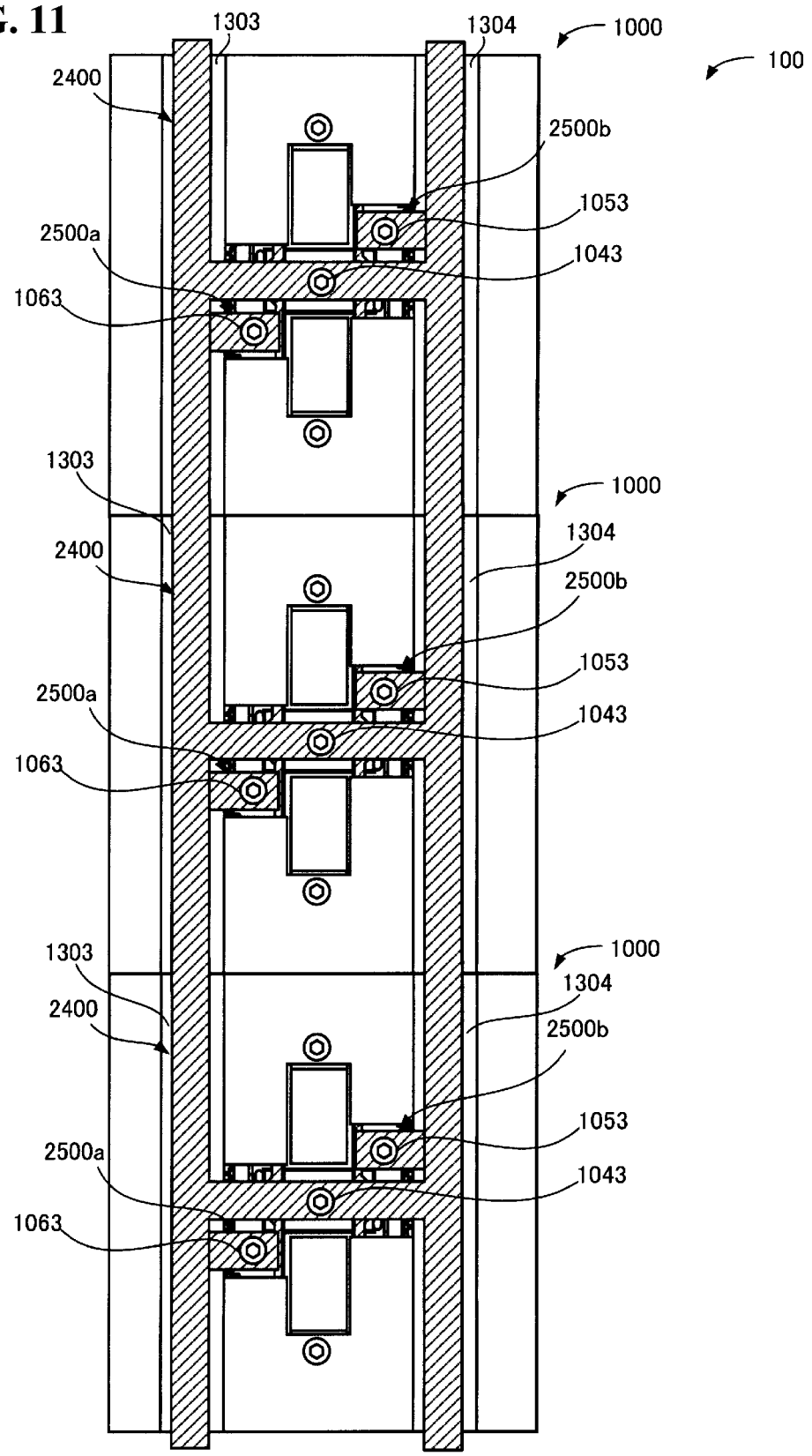
FIG. 11 is a diagram showing a semiconductor device of a second embodiment.

FIG. 11 is a diagram showing a semiconductor device of the second embodiment.

Also, FIGS. 12A and 12B are diagrams showing wiring plates of the semiconductor device of the second embodiment.

FIG. 12A shows a plan view of a gate plate, and FIG. 12B shows a plan view of auxiliary source plates.

A plurality (in the second embodiment, three) of the semiconductor modules (FIG. 8B) is prepared, and is disposed so that the guide grooves 1303 are linked and the guide grooves 1304 are linked.

For the plurality of semiconductor modules with the guide grooves linked in this way, an integrated gate plate 2400 and integrated auxiliary source plates 2500a and 2500b as shown in FIGS. 12A and 12B are prepared.

The integrated auxiliary source plate 2500a is disposed, via an insulating layer, in the linked guide grooves 1303 of the combined plurality of semiconductor modules. When disposing, bolt holes 2501a of the auxiliary source plate 2500a are aligned with the bolt holes 1061 of the auxiliary source terminals 1060. In the same way, the auxiliary source plate 2500b is also disposed, via the insulating layer, in the linked guide grooves 1304. At this time, bolt holes 2501b of the auxiliary source plate 2500b are aligned with the bolt holes 1051 of the auxiliary source terminals 1050.

Subsequently, an insulating layer is disposed on the auxiliary source plates 2500a and 2500b, in the same way as in the first embodiment.

Furthermore, the integrated gate plate 2400 is disposed via the insulating layer of the linked guide grooves 1303 and 1304. When disposing, bolt holes 2401 of the gate plate 2400 are aligned with the bolt holes 1041 of the gate terminals 1040.

Furthermore, as shown in FIG. 11, the gate plate 2400 is fixed with the bolt 1043. Also, the auxiliary source plates 2500a and 2500b are fixed with the bolts 1053 and 1063 respectively.

A plurality of the pairs of source terminals 1070 and 1080 of a semiconductor device 100 into which the semiconductor modules are combined in this way is pressed by a source conductor (not shown). Further, in the same way, a plurality of the drain plates 1010 of the semiconductor device 100 is pressed by a drain conductor (not shown). By so doing, it is possible to easily connect the plurality of semiconductor modules 1000 in parallel.

In this way, in the second embodiment, it is possible to form the semiconductor device 100 wherein the plurality of semiconductor modules 1000 is connected in parallel by combining so that the guide grooves 1303 and 1304 are linked. By so doing, it is possible to easily achieve an increase in current of the semiconductor device 100.

Third Embodiment

In a third embodiment, a description will be given, using FIGS. 13A and 13B, of a semiconductor module wherein it is possible to obtain an auxiliary source current without providing any auxiliary source terminal.

Figures 13A, 13B:
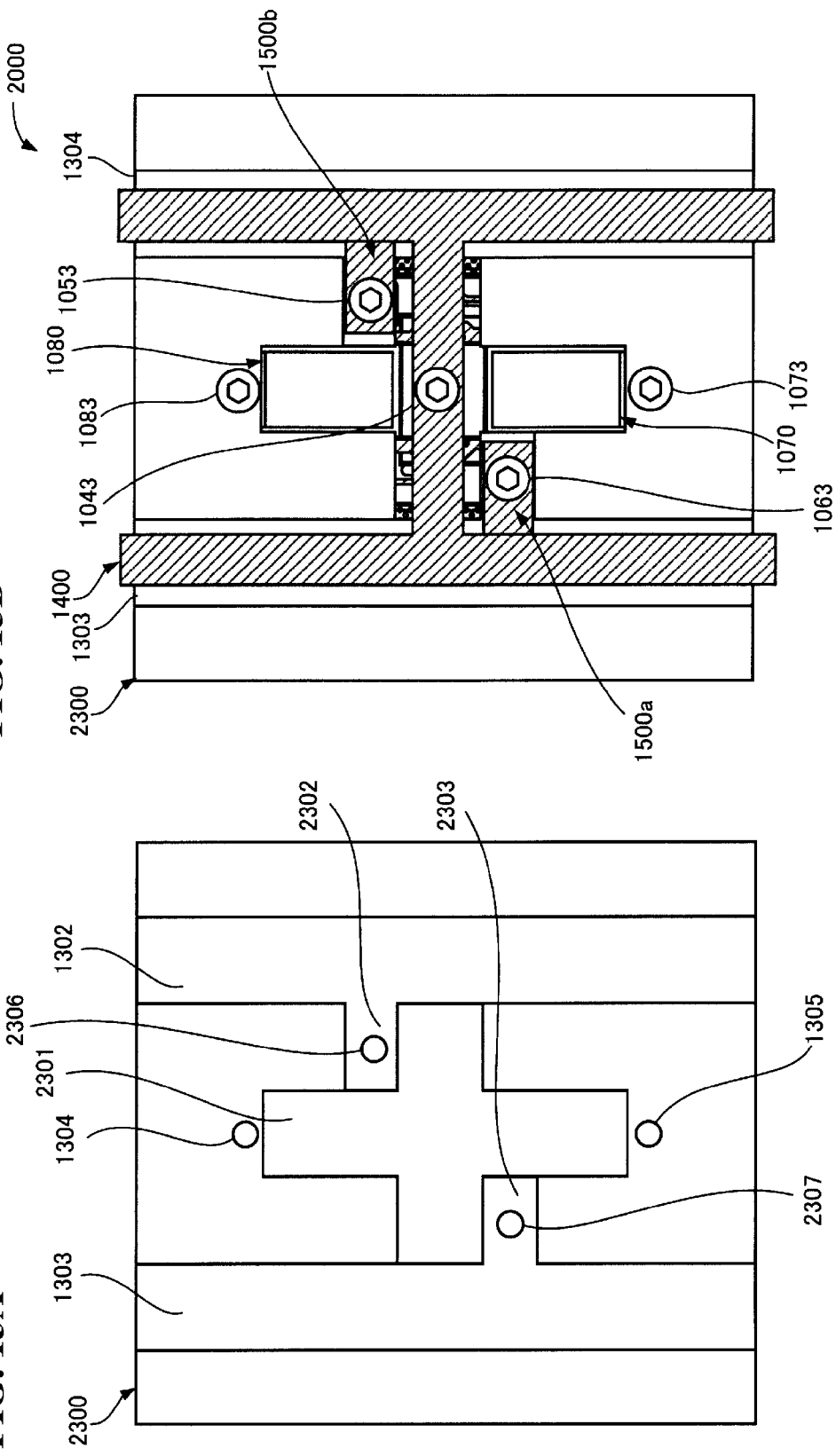
FIGS. 13A and 13B are diagrams showing a semiconductor module of a third embodiment.

FIGS. 13A and 13B are diagrams showing a semiconductor module of the third embodiment.

FIG. 13A shows a plan view of a cover 2300, and FIG. 13B shows a plan view of a semiconductor module 2000 of the third embodiment.

In the semiconductor module 2000, the auxiliary source terminals 1050 and 1060 shown in the semiconductor module 1000 of the first embodiment are not disposed. Also, as shown in FIG. 13A, an opening 2301 to expose the source terminals 1070 and 1080 and the gate terminal 1040 is formed in the cover 2300 of the semiconductor module 2000. Furthermore, the cover 2300 includes depressed portions 2302 and 2303, which are positioned at the same depth (height) as the guide grooves 1303 and 1304, and bolt holes 2306 and 2307 provided in the depressed portions 2302 and 2303. Other portions have the same structure as in the semiconductor module 1000.

This kind of cover 2300 covers the frame 1200 which houses the semiconductor elements 1020, laminated substrate 1030, and the like, in the same way as in the first embodiment. Bolt holes 1304 and 1305 are aligned with the bolt holes 1071 and 1081 of the source terminals 1070 and 1080, and bolts 1083 and 1073 are screwed in the bolt holes 1304 and 1305. By so doing, the cover 2300 is fixed to the source terminals 1070 and 1080.

Furthermore, the auxiliary source plates 1500a and 1500b are disposed in the guide grooves 1303 and 1304, via an insulating layer, in the same way as in the first embodiment. Further, the bolt holes 1501a and 1501b of the auxiliary source plates 1500a and 1500b are aligned with the bolt holes 2307 and 2306. Further, by the bolts 1053 and 1063 being screwed in, the auxiliary source plates 1500a and 1500b are fixed and electrically connected to the cover 2300. In the same way as in the first embodiment, in the case of the gate plate 1400 too, the bolt hole 1041 of the gate terminal 1040 is aligned with the bolt hole 1401, and by the bolt 1043 being screwed in, the gate plate 1400 is fixed to the gate terminal 1040.

At this time, as the cover 2300 is electrically connected to the source terminals 1070 and 1080, the cover 2300 and the source terminals 1070 and 1080 are equal in potential. In this condition, as the auxiliary source plates 1500a and 1500b are electrically connected to the cover 2300, the auxiliary source plates 1500a and 1500b are also equal in potential to the source terminals 1070 and 1080. Consequently, the second circuit plate 1031b and the auxiliary source plates 1500a and 1500b are electrically connected by way of the source terminals 1070 and 1080 and cover 2300. Therefore, it is possible to obtain an auxiliary source current from the auxiliary source plates 1500a and 1500b, in the same way as in the first embodiment.

According to the third embodiment, it is possible to suppress an increase of component members and obtain an auxiliary source current.

Fourth Embodiment

In a fourth embodiment, a description will be given, using FIGS. 14A and 14B, of a case in which the depth of the guide grooves of a semiconductor module is made shallower than the height of the gate terminal and auxiliary source terminals.

FIGS. 14A and 14B are diagrams showing a semiconductor module of the fourth embodiment.

FIG. 14A shows a plan view of a semiconductor module 3000 of the fourth embodiment, and FIG. 14B shows an enlarged sectional view on the dashed dotted line X-X of FIG. 14A.

In the semiconductor module 3000, guide grooves 3303 and 3304 are formed to be shallower than the guide grooves 1303 and 1304 of the first embodiment. The other components of the semiconductor module 3000 have the same structure as in the semiconductor module of the first embodiment. Therefore, a bottom surface 3303a of the guide groove 3303 is positioned higher than the upper end portion of the gate terminal 1040, thus making a difference in level between the guide groove 3303 and the upper end portion of the gate terminal 1040, as shown in FIG. 14B.

Therefore, the central portion of a gate plate 3400 disposed in the guide grooves 3303 and 3304 is sloped in response to the difference in level. Owing to the slope, the bolt hole of the gate plate 3400 is aligned with the bolt hole 1041 of the gate terminal 1040, and the gate plate 3400 is fixed to the gate terminal 1040 with the bolt 1043.

Also, although omitted from FIGS. 14A and 14B, a portion of each auxiliary source plate 3500a and 3500b where a bolt hole is formed is sloped, in the same way as in the gate plate 3400.

By so doing, it is possible to reduce the respective gaps (spaces) of the guide grooves 3303 and 3304 to dispose the gate plate 3400 and auxiliary source plates 3500a and 3500b. Therefore, it is possible to achieve a lower inductance of the semiconductor module 3000. Consequently, it is desirable that the depth of the guide grooves 3303 and 3304 is on the order of a combination of the thicknesses of the gate plate 3400, each auxiliary source plate 3500a and 3500b, and an insulating layer, which fits in a smallest gap.

Also, it is also possible to combine a plurality of the semiconductor modules 3000 so that the guide grooves 3303 and 3304 are linked, in the same way as in the semiconductor modules of the second embodiment (FIG. 11).

Fifth Embodiment

In a fifth embodiment, a description will be given, using FIGS. 15A and 15B, of a case in which the gate plate 1400 and auxiliary source plates 1500a and 1500b of the first embodiment are integrated into a printed circuit board.

Figure 15A:
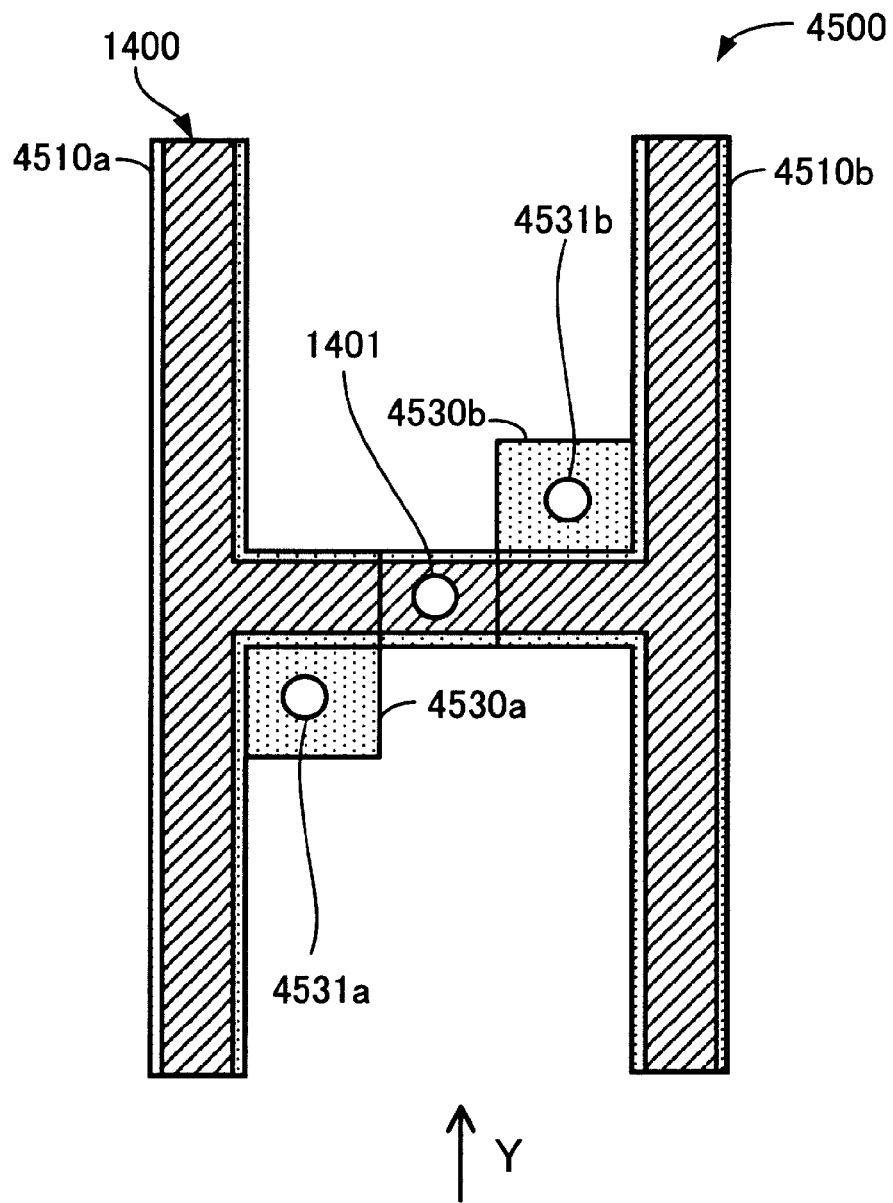
FIGS. 15A and 15B are diagrams showing a printed circuit board including a gate plate and auxiliary source plates used in a semiconductor module of a fifth embodiment.
Figure 15B:
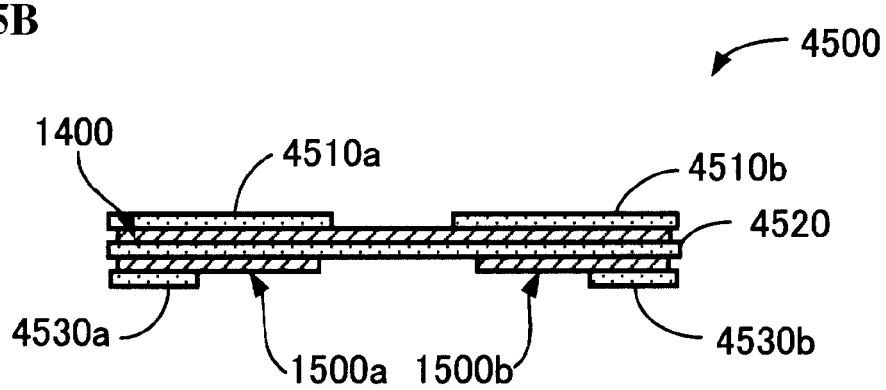

FIGS. 15A and 15B are diagrams showing a printed circuit board including a gate plate and auxiliary source plates used in a semiconductor module of the fifth embodiment.

FIG. 15A shows a plan view of a printed circuit board including the gate plate 1400 and auxiliary source plates 1500a and 1500b, and FIG. 15B shows a side view in the direction of the arrow Y of FIG. 15A.

In a printed circuit board 4500, a substrate 4520 formed of an insulating material is sandwiched between the gate plate 1400, and the auxiliary source plates 1500a and 1500b, of the first embodiment. Resist layers 4510a and 4510b are formed on the gate plate 1400, and a bolt hole 1041 portion is opened in the gate plate 1400. Also, the resist layers 4510a and 4510b are formed on the auxiliary source plates 1500a and 1500b, and openings 4531a and 4531b opposite to the bolt holes 1501a and 1501b are formed.

Further, the printed circuit board 4500 is fitted in the opening 1301 and guide grooves 1303 and 1304 of the semiconductor module 1000 of the first embodiment, and is fixed with the bolts 1043, 1053, and 1063.

By using this kind of printed circuit board 4500, it is easy to mount the gate plate 1400 and auxiliary source plates 1500a and 1500b.

In the case of combining a plurality of semiconductor modules, it is possible to integrate, for example, the gate plate 2400 and auxiliary source plates 2500a and 2500b, shown in the fourth embodiment, into a printed circuit board.

Sixth Embodiment

In a sixth embodiment, a description will be given, using FIG. 16, of a case in which six semiconductor modules are combined.

Figure 16:
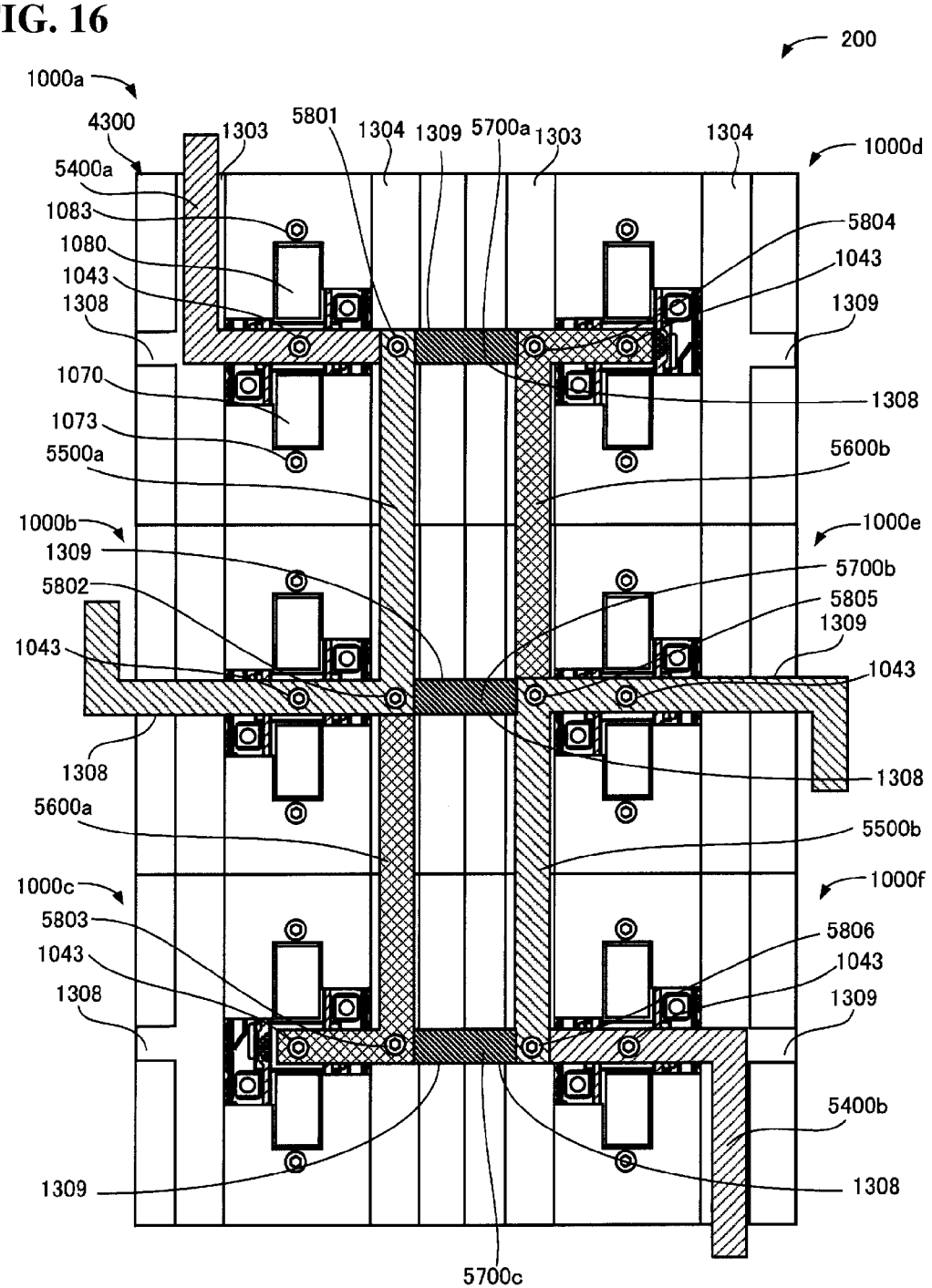
FIG. 16 is a diagram showing a semiconductor device of a sixth embodiment.

FIG. 16 is a diagram showing a semiconductor device of the sixth embodiment.

Semiconductor modules 1000a to 1000f each have the same configuration as the semiconductor module 1000. However, guide grooves 1308 and 1309 leading to the outer peripheral portion, one from the central portions of each guide groove 1303 and 1304, are further formed in a cover 4300 of the semiconductor modules 1000a to 1000f. In FIG. 16, signs are given only to components of the semiconductor module 1000a and the signs for the same components of the semiconductor modules 1000b to 1000f are omitted.

These kinds of semiconductor modules 1000a to 1000f are disposed in parallel with three lengthwise and two crosswise.

Further, a gate plate 5400a is disposed in the guide groove 1303 of the semiconductor module 1000a, and is fixed to the gate terminal 1040 of the semiconductor module 1000a with the bolt 1043.

A gate plate 5500a is disposed in the guide groove 1304 of the semiconductor module 1000a and in the guide grooves 1304 and 1308 of the semiconductor module 1000b, and is fixed to the gate terminal 1040 of the semiconductor module 1000b with the bolt 1043.

A gate plate 5600a is disposed in the guide groove 1304 of the semiconductor module 1000b and in the guide groove 1304 of the semiconductor module 1000c, and is fixed to the gate terminal 1040 of the semiconductor module 1000c with the bolt 1043.

Also, a gate plate 5600b is disposed in the guide groove 1303 of the semiconductor module 1000d and in the guide groove 1303 of the semiconductor module 1000e, and is fixed to the gate terminal 1040 of the semiconductor module 1000d with the bolt 1043.

A gate plate 5500b is disposed in the guide grooves 1303 and 1309 of the semiconductor module 1000e and in the guide groove 1303 of the semiconductor module 1000f, and is fixed to the gate terminal 1040 of the semiconductor module 1000e with the bolt 1043.

A gate plate 5400b is disposed in the guide groove 1304 of the semiconductor module 1000f, and is fixed to the gate terminal 1040 of the semiconductor module 1000f with the bold 1043.

A connection plate 5700a is disposed in the guide groove 1309 of the semiconductor module 1000a and in the guide groove 1308 of the semiconductor module 1000d. The connection plate 5700a and the gate plates 5400a and 5500a are fixed with a bolt 5801, and the connection plate 5700a and the gate plate 5600b are fixed with a bolt 5804.

A connection plate 5700b is disposed in the guide groove 1309 of the semiconductor module 1000b and in the guide groove 1308 of the semiconductor module 1000e. The connection plate 5700b and the gate plates 5500a and 5600a are fixed with a bolt 5802, and the connection plate 5700b and the gate plates 5600b and 5500b are fixed with a bolt 5805.

A connection plate 5700c is disposed in the guide groove 1309 of the semiconductor module 1000c and in the guide groove 1308 of the semiconductor module 1000f. The connection plate 5700c and the gate plate 5600a are fixed with a bolt 5803, and the connection plate 5700c and the gate plates 5500b and 5400b are fixed with a bolt 5806.

In a semiconductor device 200 into which the plurality of semiconductor modules 1000a to 1000f is combined in this way, a drain voltage is applied from the drain plate 1010 on the rear surface. Further, when a gate voltage is applied to each of the gate plates 5400a, 5500a, 5500b, and 5400b from the gate driver unit, a source current is output from each source terminal 1070 and 1080.

In this way, by the guide grooves 1308 and 1309 leading to the outer peripheral portion being disposed in the cover 4300 of the semiconductor modules, it is possible to increase the number of layout patterns of a plurality of semiconductor modules. Therefore, it is possible to more flexibly achieve an increase in current of the semiconductor device 200.

Seventh Embodiment

In a seventh embodiment, a description will be given of a case in which a guide groove to dispose an auxiliary source plate is newly provided in the semiconductor module 1000 of the first embodiment.

Figure 17:
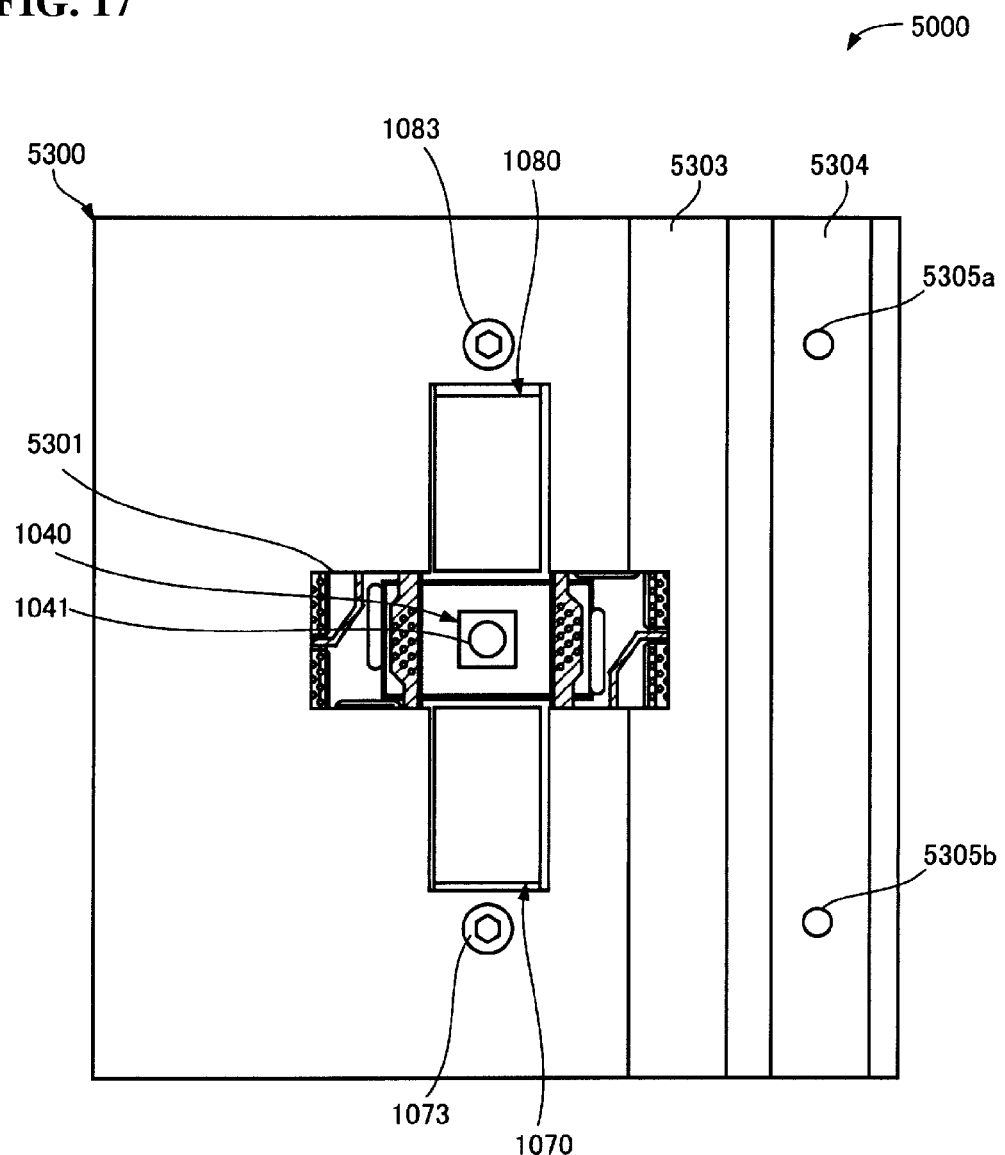
FIG. 17 is a diagram showing a semiconductor module of a seventh embodiment.

FIG. 17 is a diagram showing a semiconductor module of the seventh embodiment.

A semiconductor module 5000 has the same structure as the semiconductor module 1000 except a cover 5300.

The cover 5300 includes a guide groove 5303 formed adjacent to the gate terminal 1040 and in contact with the opening 1301. Furthermore, a guide groove 5304, disposed parallel to the guide groove 5303, in which bolt holes 5305a and 5305b are provided, is formed. Further, an unshown auxiliary source plate is disposed along the guide groove 5304, and the auxiliary source plate is fixed using the bolt holes 5305a and 5305b.

Also, the cover 5300 is fixed to the source terminals 1070 and 1080 with the bolts 1073 and 1083. Therefore, the cover 5300 is equal in potential to the source terminals 1070 and 1080. Consequently, it is possible to make the second circuit plate 1031b and auxiliary source plate equal in potential.

The guide groove 5303 to dispose the gate plate can also be formed not only in the formation position of FIG. 17, but also on each side of the opening 5301, in the same way as in the first embodiment, or can also be formed on only the left side in FIG. 17 of the opening 5301.

Also, a description will be given, using FIG. 18, of a case in which a plurality of the semiconductor modules 5000 is combined.

Figure 18:
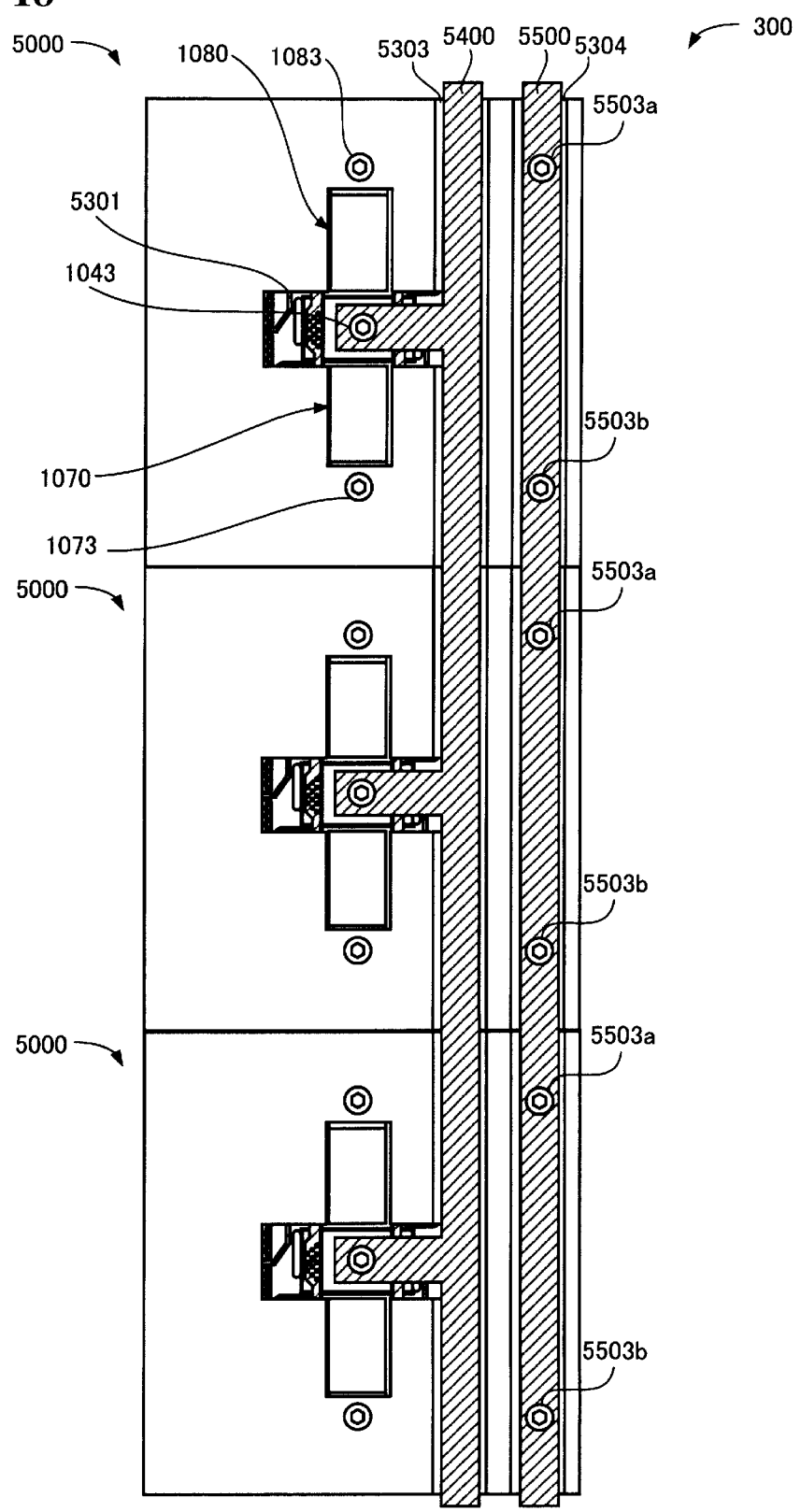
FIG. 18 is a diagram showing a semiconductor device into which a plurality of the semiconductor modules of the seventh embodiment is combined.

FIG. 18 is a diagram showing a semiconductor device into which a plurality of the semiconductor modules of the seventh embodiment is combined.

A plurality (in the seventh embodiment, three) of the semiconductor modules 5000 is prepared, and is disposed so that the guide grooves 5303 are linked and the guide grooves 5304 are linked.

A gate plate 5400 is disposed in the linked guide grooves 5303 via an insulating layer, and the gate plate 5400 is fixed to the gate terminals 1040 with the bolts 1043.

In the same way, an auxiliary source plate 5500 is disposed in the linked guide grooves 5304 via an insulating layer, and the auxiliary source plate 5500 is fixed in the guide grooves 5304 with bolts 5503a and 5503b.

In a semiconductor device 300 into which the plurality of semiconductor modules 5000 is combined in this way, source currents output from the individual semiconductor modules 5000 are combined, and it is possible to achieve an increase in current of the semiconductor device.

Eighth Embodiment

In an eighth embodiment, a description will be given of a case in which a guide groove to dispose an auxiliary source plate is provided in a different portion in the semiconductor module 5000 of the seventh embodiment.

Figure 19B:
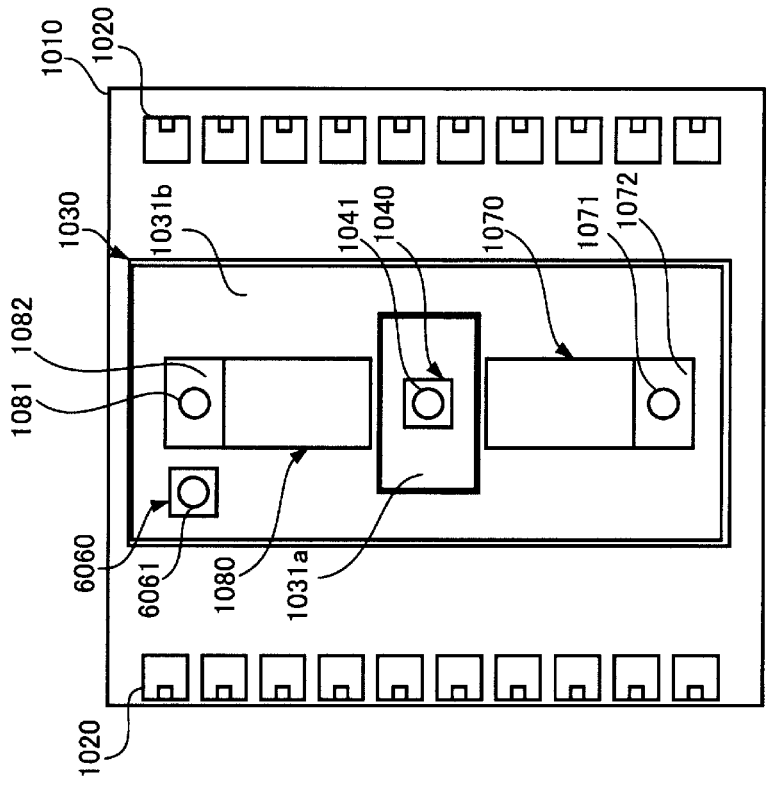
FIGS. 19A and 19B are diagrams showing a semiconductor module of an eighth embodiment.
Figure 19A:
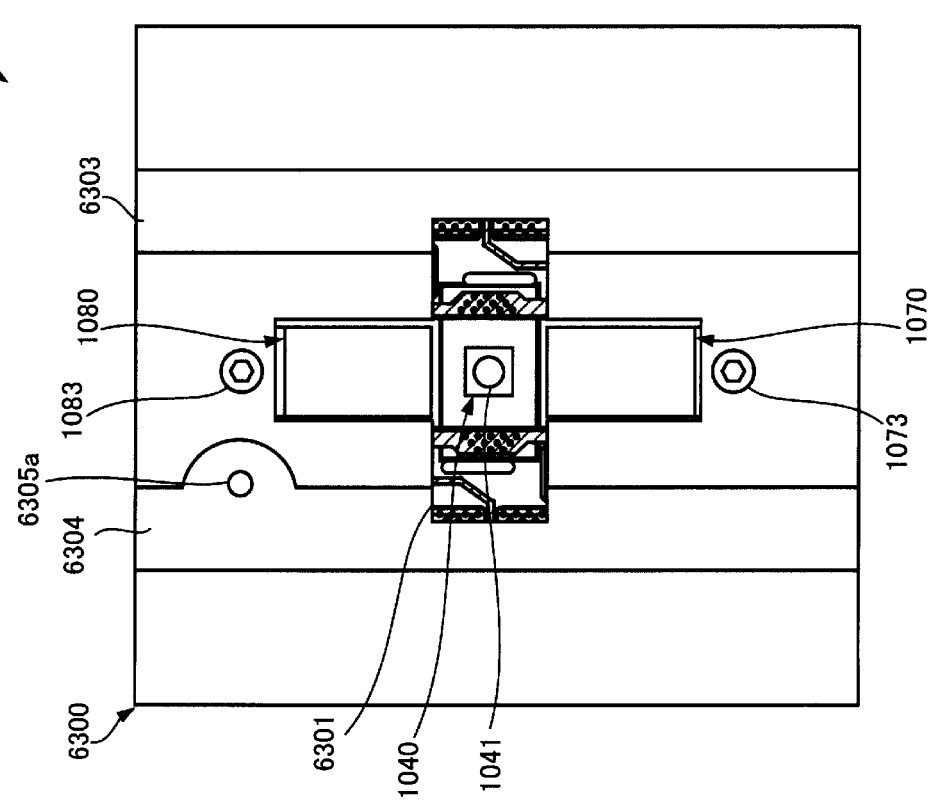

FIGS. 19A and 19B are diagrams showing a semiconductor module of the eighth embodiment.

FIG. 19A shows a plan view of a semiconductor module 6000 in which a cover 6300 is installed, and FIG. 19B shows an internal plan view of the semiconductor module 6000.

The semiconductor module 6000 has the same configuration as the semiconductor module 1000 except a cover 6300 and auxiliary source terminal 6060.

The cover 6300 includes a guide groove 6303 adjacent to the gate terminal 1040 and in contact with an opening 6301. Furthermore, an auxiliary guide groove 6304, provided parallel to the guide groove 6303, in which a bolt hole 6305a is provided is formed on the left side in FIG. 19A of the opening 6301.

The auxiliary source terminal 6060 is disposed on the second circuit plate 1031b. When the cover 6300 is installed on the frame 1200, the bolt hole 6305a of the auxiliary guide groove 6304 is aligned with a bolt hole 6061 of the auxiliary source terminal 6060.

Further, an unshown auxiliary source plate is disposed along the auxiliary guide groove 6304 via an insulating layer, and is fixed with an unshown bolt using the bolt hole 6305a.

Also, a description will be given, using FIG. 20, of a semiconductor device 400 into which a plurality of these kinds of semiconductor modules 6000 is combined.

Figure 20:
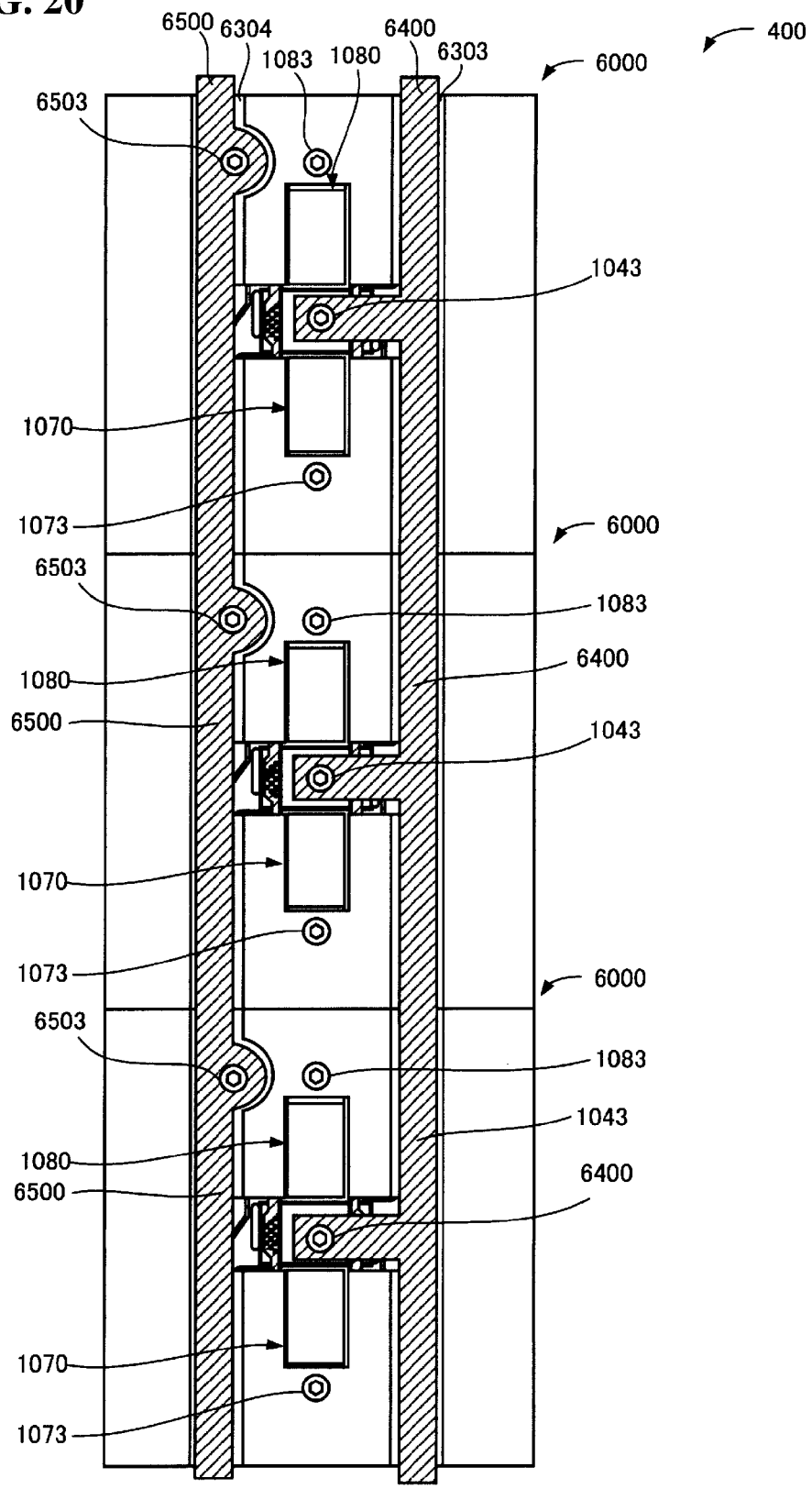
FIG. 20 is a diagram showing a semiconductor device into which a plurality of the semiconductor modules of the eighth embodiment is combined.

FIG. 20 is a diagram showing a semiconductor device into which a plurality of the semiconductor modules of the eighth embodiment is combined.

A plurality (in the eighth embodiment, three) of the semiconductor modules 6000 is prepared, and is disposed so that the guide grooves 6303 are linked and the auxiliary guide grooves 6304 are linked.

Further, a gate plate 6400 is disposed in the linked guide grooves 6303 via an insulating layer, and the gate plate 6400 is fixed to the gate terminals 1040 with the bolts 1043.

In the same way, an auxiliary source plate 6500 is disposed in the linked auxiliary guide grooves 6304 via the insulating layer, and the auxiliary source plate 6500 is fixed by bolts 6503 being screwed in bolt holes 6305a of the auxiliary guide grooves 6304.

In the semiconductor device 400 into which the semiconductor modules 6000 are combined in this way, source currents output from the individual semiconductor modules 6000 are combined, and it is possible to achieve an increase in current of the semiconductor device 400.

Ninth Embodiment

In a ninth embodiment, a description will be given, using FIGS. 21 and 22, of a case in which the semiconductor modules 1000 are combined in series.

Figure 21:
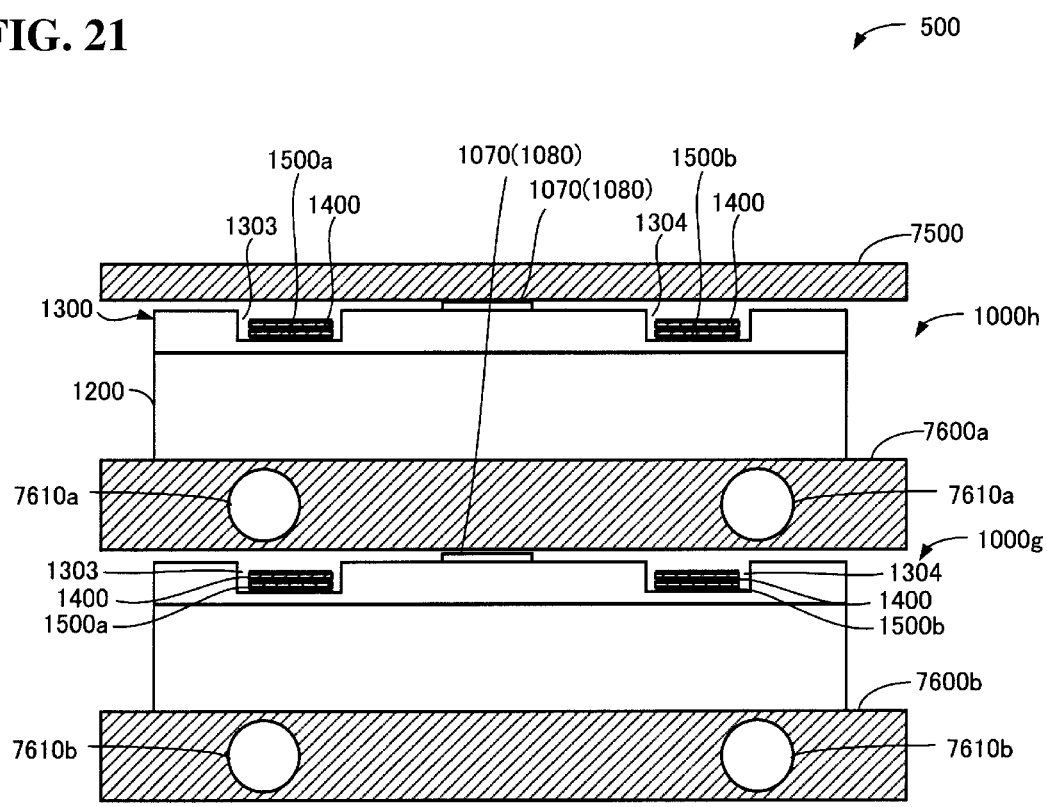
FIG. 21 is a side view showing a semiconductor device of a ninth embodiment.
Figure 22:
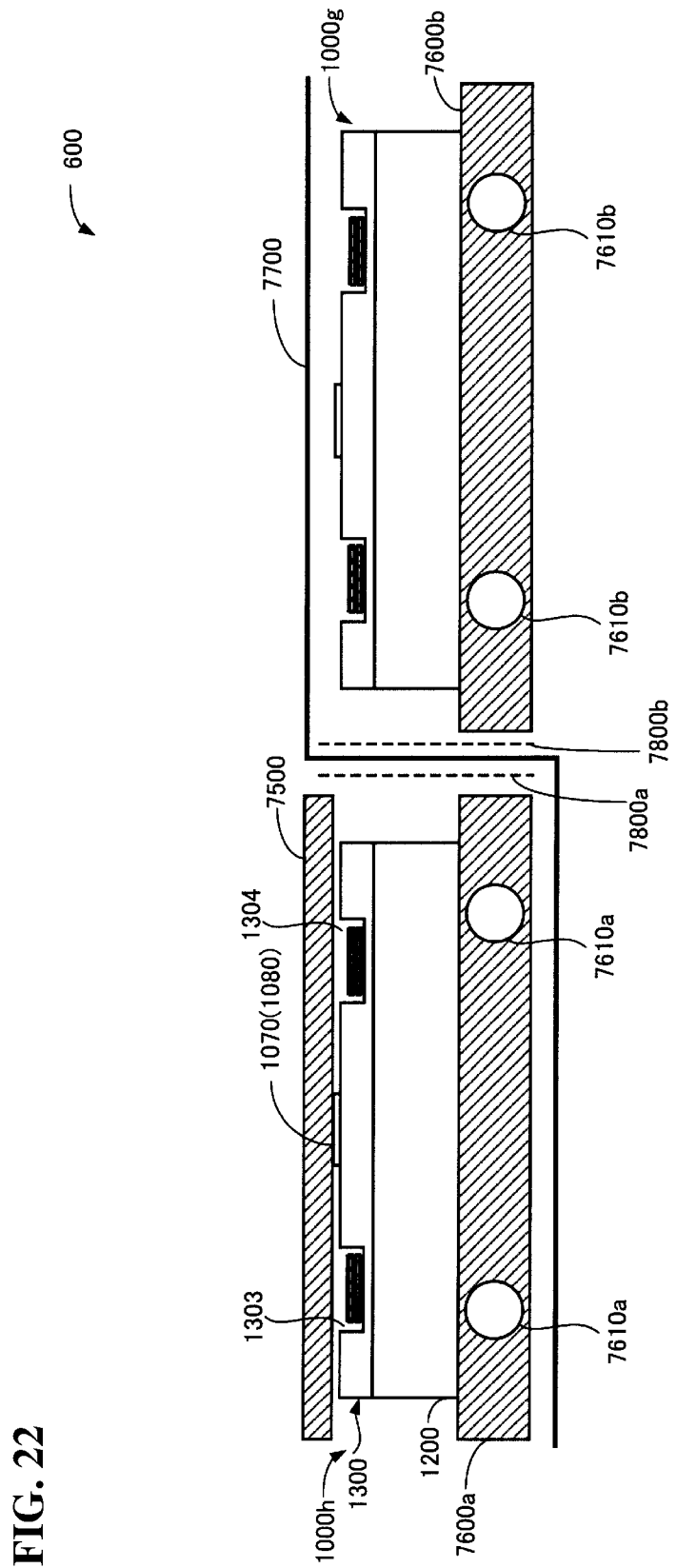
FIG. 22 is a side view showing a semiconductor device of the ninth embodiment.

FIGS. 21 and 22 are side views showing semiconductor devices of the ninth embodiment.

FIG. 21 is a side view showing a semiconductor device wherein a plurality of semiconductor modules is laid out in a vertical direction and combined in series, and FIG. 22 is a side view showing a semiconductor device wherein a plurality of semiconductor modules is laid out in a lateral direction and combined in series.

As shown in FIG. 21, a semiconductor module 1000g of the first embodiment is mounted on a metal cooling fin 7600b, and the drain plate 1010 of the semiconductor module 1000g and the cooling fin 7600b are electrically connected. A cooling fin 7600a is mounted on the semiconductor module 1000g, and the source terminals 1070 and 1080 of the semiconductor module 1000g and the cooling fin 7600a are electrically connected.

A semiconductor module 1000h is further mounted on the cooling fin 7600a, and the drain plate 1010 of the semiconductor module 1000h and the cooling fin 7600a are electrically connected. A source plate 7500 is brought into pressure contact with the source terminals 1070 and 1080 of the semiconductor module 1000h.

Pipes 7610a and 7610b through which water flows are formed inside the respective cooling fin 7600a and 7600b. The cooling fins 7600a and 7600b, by water flowing through the pipes 7610a and 7610b, can effectively cool the semiconductor modules 1000h and 1000g.

In a semiconductor device 500 into which the semiconductor modules 1000h and 1000g are stacked and combined in this way, a drain voltage is applied from the cooling fin 7600b, and a gate voltage is applied to the gate plate 1400 of each semiconductor module 1000g and 1000h from the gate driver unit. Then, a source current output by way of the semiconductor module 1000g, cooling fin 7600a, and semiconductor module 1000h is obtained from the source plate 7500. That is, the rated voltage of the semiconductor device 500 of the ninth embodiment is twice as high as the rated voltage of the semiconductor module 1000.

In the ninth embodiment, there are two, or two tiers of, semiconductor modules 1000h and 1000g, but the invention not being limited to two tiers, three or more tiers can be stacked and connected in series. Also, the semiconductor modules 1000 are combined in parallel, as in the second and sixth embodiments, and furthermore, a desired number of tiers of semiconductor modules 1000 can also be installed in series. For example, in the case of stacking three tiers in series, a total of nine semiconductor modules 1000, two in parallel at the first tier, four in parallel at the second tier, and three in parallel at the third tier, are installed in order from the drain plate 1010 to the source terminals 1070 and 1080. The rated voltage and rated current of the semiconductor device at this time do not have to match with those of the nine semiconductor modules 1000. When there is no match in rated voltage, the rated voltage of the semiconductor device is equal to the sum of the rated voltages of three semiconductor modules 1000, each of which is lowest in rated voltage at each tier. Also, when there is no match in rated current, the rated current of the semiconductor device is equal to the rated current of a tier which is the lowest in rated current of all the three tiers.

Also, the invention is not limited to the cooling fin 7600a or 7600b, and the semiconductor modules can also be stacked via conductive members, or the semiconductor modules 1000h and 1000g can also be directly stacked one on the other.

Next, a description will be given, using FIG. 22, of a case in which a plurality of the semiconductor modules 1000 is disposed in the lateral direction when connecting the plurality of semiconductor modules 1000 in series.

In a semiconductor device 600, the cooling fins 7600a and 7600b are disposed in parallel, the semiconductor module 1000h is disposed on the cooling fin 7600a, and the semiconductor module 1000g is disposed on the cooling fin 7600b, as shown in FIG. 22. The cooling fin 7600a connected to the drain plate of the semiconductor module 1000h and the source terminals 1070 and 1080 of the semiconductor module 1000g are electrically connected by pressure contact by a metal plate 7700. However, the cooling fins 7600a and 7600b and the metal plate 7700 are electrically insulated with insulating layers 7800a and 7800b sandwiched between the respective cooling fin 7600a and 7600b and the metal plate 7700.

In this way, the semiconductor modules 1000 can be laid out in the lateral direction and connected in series.

What is claimed is:

1. A semiconductor module, comprising:
   a drain plate;
   a semiconductor element having a gate electrode and source electrode on a front surface, and a drain electrode on a rear surface, and disposed on the front surface of the drain plate, the drain electrode being electrically connected to the drain plate;
   a laminated substrate having an insulating plate, and a first circuit plate and a second circuit plate provided on a front surface of the insulating plate, and disposed on the front surface of the drain plate, the first circuit plate being electrically connected to the gate electrode, and the second circuit plate being electrically connected to the source electrode;
   a gate terminal disposed on the first circuit plate;
   a source terminal disposed on the second circuit plate; and
   a cover having an opening and a guide groove, and disposed to face the front surface of the drain plate, the gate terminal and the source terminal being positioned in the opening, the guide groove contacting the opening and extending to an outer peripheral portion.

2. The semiconductor module according to claim 1, further comprising:
a gate plate electrically connected to the gate terminal and extending along the guide groove to the outer peripheral portion.

3. The semiconductor module according to claim 2, further comprising:
an auxiliary source terminal disposed on the second circuit plate and positioned in the opening; and
an auxiliary source plate electrically connected to the auxiliary source terminal, electrically insulated from the gate plate, and extending along the guide groove to the outer peripheral portion.

4. The semiconductor module according to claim 2, further comprising:
an auxiliary guide groove provided in the cover; and
an auxiliary source plate extending along the auxiliary guide groove to the outer peripheral portion,
wherein the guide groove is formed to contact one side of the opening,
the auxiliary guide groove is formed to contact the other side of the opening, and
the second circuit plate and the auxiliary source plate are electrically connected through the source terminal and the cover.

5. The semiconductor module according to claim 1, wherein
the second circuit plate is disposed on the front surface of the insulating plate to surround the first circuit plate.

6. The semiconductor module according to claim 5, wherein
the gate terminal is provided on the first circuit plate so as to be positioned on a line crossing a midpoint of the guide groove.

7. The semiconductor module according to claim 6, wherein
a pair of source terminals is provided on the second circuit plate, and
the gate terminal and the pair of source terminals are linearly disposed parallel to the guide groove.

8. The semiconductor module according to claim 1, wherein
a bottom portion of the guide groove is positioned higher than an upper end portion of the gate terminal.

9. A semiconductor device, comprising:
a plurality of the semiconductor modules according to claim 2, wherein the plurality of semiconductor modules is disposed so that a plurality of the guide grooves is linked, and
the integrated gate plate is disposed along linked guide grooves.

10. A semiconductor device, comprising:
a plurality of the semiconductor modules according to claim 3, wherein the plurality of semiconductor modules is disposed so that a plurality of guide grooves are linked, and
the integrated gate plate and the integrated auxiliary source plate are disposed along linked guide grooves.

11. A semiconductor device, comprising:
a plurality of the semiconductor modules according to claim 4, wherein the plurality of semiconductor modules is disposed so that a plurality of the guide grooves is linked, and a plurality of the auxiliary guide grooves is linked,
the integrated gate plate is disposed along a linked guide grooves, and
the integrated auxiliary source plate is disposed along a linked auxiliary guide grooves.

12. A semiconductor device, comprising:
a plurality of the semiconductor modules according to claim 1, wherein the source terminal of one of the semiconductor modules and the drain plate of another semiconductor module are electrically connected.

13. The semiconductor device according to claim 12, wherein
the plurality of semiconductor modules is stacked, and
the source terminal of one of the semiconductor modules and the drain plate of an adjacent semiconductor module are electrically connected.

14. The semiconductor device according to claim 12, wherein
the plurality of semiconductor modules is disposed side by side, and
the source terminal of one of the semiconductor modules and the drain plate of an adjacent semiconductor module are electrically connected through a conductive member.

* * * * *